United States Patent
Taniguchi

(10) Patent No.: US 8,823,468 B2
(45) Date of Patent: Sep. 2, 2014

(54) MULTILAYER FILTER

(75) Inventor: Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 435 days.

(21) Appl. No.: 13/276,390

(22) Filed: Oct. 19, 2011

(65) Prior Publication Data

US 2012/0098622 A1  Apr. 26, 2012

(30) Foreign Application Priority Data

Oct. 21, 2010 (JP) ................................ 2010-236067

(51) Int. Cl.
*H03H 7/09* (2006.01)
*H03H 7/42* (2006.01)
*H03H 7/01* (2006.01)
*H03H 1/00* (2006.01)

(52) U.S. Cl.
CPC ............... *H03H 7/42* (2013.01); *H03H 7/1775* (2013.01); *H03H 7/09* (2013.01); *H03H 2001/0085* (2013.01)
USPC ............................................ 333/185; 333/25

(58) Field of Classification Search
CPC . H03H 2001/0085; H03H 7/42; H03H 7/422; H01P 5/10
USPC .................................................... 333/25, 185
See application file for complete search history.

(56) References Cited

U.S. PATENT DOCUMENTS 7,432,786 B2 * 10/2008 Tomaki et al. ................ 333/204
2008/0272855 A1 * 11/2008 Ono et al. ..................... 333/134
2009/0079516 A1    3/2009 Miyata et al.

FOREIGN PATENT DOCUMENTS

JP   2006-229464 A    8/2006
WO   2009/142113 A1   11/2009

OTHER PUBLICATIONS

Taniguchi, "Multilayer Filter," U.S. Appl. No. 13/276,397, filed Oct. 19, 2011.

* cited by examiner

*Primary Examiner* — Benny Lee
*Assistant Examiner* — Rakesh Patel
(74) *Attorney, Agent, or Firm* — Keating & Bennett, LLP

(57) ABSTRACT

A multilayer filter includes a laminate including a plurality of dielectric layers stacked on each other. Inner layer electrodes and outer terminals are provided in the laminate. First and second balanced-side capacitors connected in series between first and second balanced terminals are defined by the inner layer electrodes. An inner-layer plate electrode not connected to any outer terminals is provided on the first dielectric layer. A first plate electrode connected to the first balanced terminal and a second plate electrode connected to the second balanced terminal are provided on the second dielectric layer in opposing relation to the inner-layer plate electrode. The inner-layer plate electrode and the first plate electrode and the first dielectric layer constitute the first balanced-side capacitor, and the inner-layer plate electrode and the second plate electrode and the first dielectric layer constitute the second balanced-side capacitor.

8 Claims, 23 Drawing Sheets

MULTILAYER FILTER

BACKGROUND OF THE INVENTION

1. Field of the Invention

The present invention relates to a multilayer filter including a plurality of stacked dielectric layers on each of which a predetermined electrode pattern is provided, and more particularly to a multilayer filter including balanced output terminals.

2. Description of the Related Art

Previously, various types of multilayer circuit elements have been proposed in which predetermined circuit functions are realized by stacking a plurality of dielectric layers on each of which a predetermined electrode pattern is formed. As one of those multilayer circuit elements, there is a multilayer filter for realizing a filter function. Further, there is a multilayer filter having an unbalanced-balanced transforming function (hereinafter referred to as a "multilayer balance filter") as disclosed in Japanese Unexamined Patent Application Publication No. 2006-229464.

In the related-art multilayer balance filter, as disclosed in Japanese Unexamined Patent Application Publication No. 2006-229464, two balanced output terminals arranged in a pair are each connected to a ground through a capacitor.

However, when that type of multilayer balance filter is mounted to a mother board, a phase reference for a signal may often be deviated from a desired value depending on the specifications of ground wiring patterns on the mother board and the mounted state of the multilayer balance filter to the mother board (such as a difference in amount of a solder for each mounting electrode). This makes it difficult to obtain a stable balance characteristic between the two balanced terminals.

SUMMARY OF THE INVENTION

Accordingly, preferred embodiments of the present invention provide a multilayer filter capable of ensuring a stable balance characteristic.

A preferred embodiment of the present invention provides a multilayer filter including a laminate that includes a plurality of dielectric layers stacked on each other. The multilayer filter includes an unbalanced terminal, a first balanced terminal and a second balanced terminal corresponding to the unbalanced terminal, and a filter circuit, which are defined by inner layer electrodes and outer electrodes in the laminate.

In the above-described arrangement of the multilayer filter according to a preferred embodiment of the present invention, a capacitor is connected between the first balanced terminal and the second balanced terminal. The capacitor includes a first capacitor and a second capacitor, which are connected in series. The first capacitor includes, as one of opposed electrodes thereof, a first inner-layer plate electrode electrically connected to a terminal electrode defining the first balanced terminal and, as the other of the opposed electrodes, a first floating electrode not connected to a ground. The second capacitor includes, as one of opposed electrodes thereof, a second inner-layer plate electrode electrically connected to a terminal electrode defining the second balanced terminal and, as the other of the opposed electrodes, a second floating electrode not connected to the ground.

With the arrangement described above, only a serial circuit including the first capacitor and the second capacitor is connected between the first balanced terminal and the second balanced terminal. Further, the serial circuit including the first capacitor and the second capacitor is not connected to the ground, and a connection point between the first capacitor and the second capacitor defines a so-called floating ground. Therefore, a balance characteristic between the balanced terminals is not affected by external ground wiring patterns and being in the mounted state.

In the multilayer filter according to a preferred embodiment of the present invention, the first floating electrode and the second floating electrode are preferably defined by one common floating electrode.

The arrangement described above represents a practical structure of the first capacitor and the second capacitor. With that structure, since the common floating electrode preferably defines the floating ground, the influence of variations in formation of the inner layer electrodes in the laminate is minimized and prevented and a stable balance characteristic can be more easily realized.

In the multilayer filter according to a preferred embodiment of the present invention, a first electrode group including the first inner-layer plate electrode and the first floating electrode and a second electrode group including the second inner-layer plate electrode and the second floating electrode are provided on different dielectric layers. Further, the first electrode group and the second electrode group are arranged to be at least partially overlapped with each other, when looking at the laminate in a stacking direction thereof.

With the arrangement described above, since the first capacitor and the second capacitor are arranged to be aligned in the stacking direction, the size of the laminate can be reduced, as viewed from above, in comparison with the case where the first capacitor and the second capacitor are provided on the same dielectric layer, in order to obtain the same capacitance.

In the multilayer filter according to a preferred embodiment of the present invention, respective shapes of the first inner-layer plate electrode, the second inner-layer plate electrode, the first floating electrode, and the second floating electrode and thicknesses of the dielectric layers are determined such that the first capacitor and the second capacitor have different capacitances.

In the multilayer filter according to a preferred embodiment of the present invention, respective shapes of the first inner-layer plate electrode, the second inner-layer plate electrode, the first floating electrode, and the second floating electrode and thicknesses of the dielectric layers are determined such that the first capacitor and the second capacitor have the same capacitance.

The arrangements described above represent that the capacitor connected between the first balanced terminal and the second balanced terminal is provided by the serial circuit including the first and second capacitors, and that the respective capacitances of the first capacitor and the second capacitor can be appropriately set. As a result, phase balance between the first balanced terminal and the second balanced terminal can be appropriately set and the stable balance characteristic can be obtained.

In the multilayer filter according to a preferred embodiment of the present invention, an unbalanced-side inductor electrode and an electrode pair constituting an unbalanced-side capacitor are connected between a terminal electrode forming the unbalanced terminal and a ground electrode. Further, three or more odd-numbered balanced-side inductor electrodes are connected in series between the terminal electrode defining the first balanced terminal and the terminal electrode defining the second balanced terminal. Still further, one of the odd-numbered balanced-side inductor electrodes at a center in an array sequence thereof and the unbalanced-side inductor electrode are positioned to be electromagnetically coupled with each other. Still further, the odd balanced-side inductor electrodes include substantially helical coils arranged to extend in the same winding direction as viewed in the stacking direction.

The arrangement described above represents a more detailed structure of the multilayer filter. With that arrangement, the multilayer filter can be realized which has the stable balance characteristic and a small insertion loss, and which can easily perform impedance adjustment on the balanced terminal side.

According to various preferred embodiments of the present invention, the balance characteristic on the balanced terminal side can be stabilized in the multilayer filter having the unbalanced-balanced transforming function.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A multilayer filter according to a first preferred embodiment of the present invention will be described below with reference to the drawings.

Figure 1:
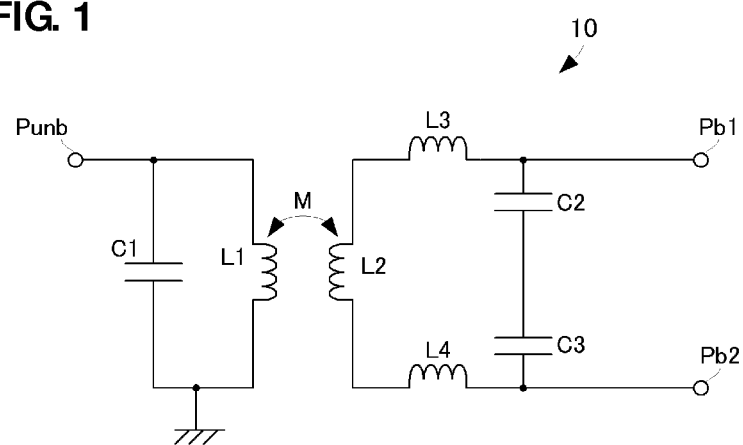
FIG. 1 is a circuit diagram of a multilayer filter according to a first preferred embodiment of the present invention.

First, a circuit configuration of a multilayer filter 10 is described. FIG. 1 is a circuit diagram of the multilayer filter 10 according to the first preferred embodiment.

The multilayer filter 10 includes an unbalanced terminal Punb for inputting and outputting an unbalanced signal, and a first balanced terminal Pb1 and a second balanced terminal Pb2 for inputting and outputting balanced signals.

A parallel resonance circuit including an unbalanced-side capacitor C1 and an unbalanced-side inductor L1 is connected between the unbalanced terminal Punb and the ground.

Three balanced-side inductors L3, L2 and L4 are connected in series between the first balanced terminal Pb1 and the second balanced terminal Pb2. The balanced-side inductors L3, L2 and L4 are connected in the order named, i.e., in the order of the balanced-side inductors L3, L2 and L4, looking from the first balanced terminal Pb1. As described later, the balanced-side inductors L3, L2 and L4 are provided in the form of substantially helical coils having the same winding direction. While three balanced-side inductors are preferably included in the illustrated preferred embodiment, the number of balanced-side inductors may be some other suitable value as long as it is an odd number other than one.

The balanced-side inductor L2 is arranged to be electromagnetically coupled with the unbalanced-side inductor L1. Such an arrangement causes a mutual inductor M to act between the balanced-side inductor L2 and the unbalanced-side inductor L1.

Further, a serial circuit including a first balanced-side capacitor C2 and a second balanced-side capacitor C3 is connected between the first balanced terminal Pb1 and the second balanced terminal Pb2. The first balanced-side capacitor C2 and the second balanced-side capacitor C3 are connected in the order named, i.e., in the order of the first and second balanced-side capacitor C2 and C3, looking from the first balanced terminal Pb1.

In the multilayer filter 10 having the above-described circuit configuration, when an unbalanced signal is input through the unbalanced terminal Punb, the input signal is subjected to unbalanced-balanced transformation, and balanced signals in predetermined phases are output from the first balanced terminal Pb1 and the second balanced terminal Pb2. In addition, a center frequency of a filter passage band is designed by the resonance circuit including the unbalanced-side inductor L1 and the unbalanced-side capacitor C1. Thus, a filter with the unbalanced-balanced transforming function is provided.

By setting the balanced-side inductors L3 and L4 and the first and second balanced-side capacitors C2 and C3 to the desired element values, output impedances of the balanced signals can be set to the desired values. Moreover, since the winding directions of the balanced-side inductors L3, L2 and L4 are the same, a loss can be reduced and a filter having a smaller insertion loss can be constituted.

Further, by setting the first balanced-side capacitor C2 and the second balanced-side capacitor C3 to the desired element values, the phase balance between the balanced signals output from the first balanced terminal Pb1 and the second balanced terminal Pb2 can be designed to the desired value.

Figure 2:
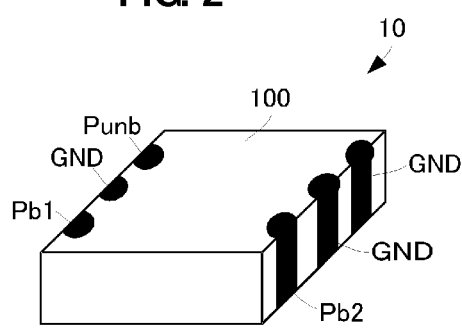
FIG. 2 is an external perspective view of the multilayer filter according to the first preferred embodiment of the present invention.
Figure 3:
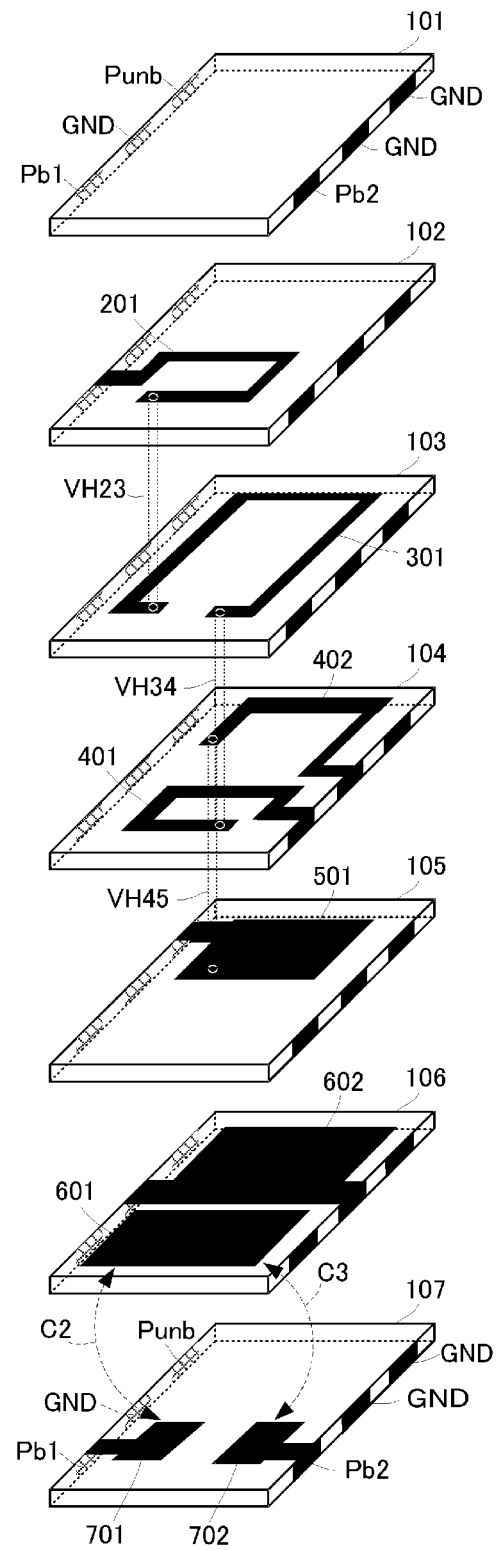
FIG. 3 is an exploded perspective view of the multilayer filter according to the first preferred embodiment of the present invention.

A structure of the multilayer filter 10 having the above-described circuit configuration will be described below. FIG. 2 is an external perspective view of the multilayer filter 10 according to the first preferred embodiment, and FIG. 3 is an exploded perspective view of the multilayer filter 10 according to the first preferred embodiment.

The multilayer filter 10 is realized with a laminate 100 that preferably includes seven dielectric layers 101 to 107, for example, stacked on each other.

As illustrated in FIG. 2, the laminate 100 preferably is substantially parallelepiped in its external shape. An outer electrode for the unbalanced terminal (hereinafter referred to as the "unbalanced terminal Punb"), a ground electrode (hereinafter referred to as a "ground terminal GND"), and an outer electrode for the first balanced terminal (hereinafter referred to as the "first balanced terminal Pb1") are provided on a first lateral surface of the laminate 100 and are arranged in the order named. Two ground terminals GND and an outer electrode for the second balanced terminal (hereinafter referred to as the "second balanced terminal Pb2") are provided on a second lateral surface of the laminate 100, which is positioned opposite to the first lateral surface thereof, and are arranged in the order named. In such a structure, the first balanced terminal Pb1 and the second balanced terminal Pb2 are arranged opposite to each other.

The unbalanced terminal Punb, the first balanced terminal Pb1, the second balanced terminal Pb2, and the ground terminals GND, serving as outer terminals of the multilayer filter 10, have shapes extending in the stacking direction and are each defined by an electrode pattern spanning over all the dielectric layers 101 to 107 that constitute the laminate 100. It is to be noted that, in the following description of the dielectric layers, the positions where the outer terminals are located and the shapes of the outer terminals are not described except for connection relationships of the outer terminals with respect to inner layer electrodes.

Electrode patterns provided on the dielectric layers 101 to 107 will be described in detail below. The following description is made on an assumption that an uppermost layer of the laminate 100 is called the dielectric layer 101 and a lowermost layer of the laminate 100 is called the dielectric layer 107 while the reference number of the dielectric layer is successively increased toward the lowermost layer.

Only the electrode patterns for the above-mentioned outer terminals are provided on the dielectric layer 101 that is the uppermost layer of the laminate 100. Though not illustrated, a marking electrode used to determine the mounting direction is preferably provided on an upper surface of the dielectric layer 101, i.e., on a top surface of the laminate 100.

A coil electrode 201 is provided on the dielectric layer 102. One end of the coil electrode 201 is connected to the first balanced terminal Pb1 on the first lateral surface. The coil electrode 201 preferably has a coiled shape, as viewed from above, starting from the one end thereof. The other end of the coil electrode 201 is connected to one end of a coil electrode 301 on the dielectric layer 103 through an electroconductive via electrode VH23. The coil electrode 201 constitutes the balanced-side inductor L3.

The coil electrode 301 is provided on the dielectric layer 103. The one end of the coil electrode 301 is, as described above, connected to the other end of the coil electrode 201 through the via electrode VH23.

The coil electrode 301 preferably has a coiled shape, starting from the one end thereof. More specifically, the coil electrode 301 is arranged to extend in the same winding direction as the coil electrode 201, when looking at the laminate 100 from above. The other end of the coil electrode 301 is connected to one end of a coil electrode 401 on the dielectric layer 104 through an electroconductive via electrode VH34. The coil electrode 301 constitutes the balanced-side inductor L2.

Coil electrodes 401 and 402 are provided on the dielectric layer 104. The one end of the coil electrode 401 is, as described above, connected to the other end of the coil electrode 301 through the via electrode VH34.

The coil electrode 401 preferably has a coiled shape, starting from the one end thereof. The coil electrode 401 is arranged to extend in the same winding direction as the coil electrodes 201 and 301, when looking at the laminate 100 from above. The other end of the coil electrode 401 is connected to the second balanced terminal Pb2 on the second lateral surface. The coil electrode 401 constitutes the balanced-side inductor L4.

One end of the coil electrode 402 is connected to the ground terminal GND at a center of the second lateral surface. The coil electrode 402 preferably has a coiled shape, starting from the one end thereof. The coil electrode 402 is arranged to extend in the winding direction reversed to that of the coil electrode 201, when looking at the laminate 100 from above. The other end of the coil electrode 402 is connected to a plate electrode 501 on the dielectric layer 105 through an electroconductive via electrode VH45. The coil electrode 402 constitutes the unbalanced-side inductor L1.

Moreover, the coil electrode 402 is located at a position where at least a portion thereof overlaps with the coil electrode 301, when looking at the laminate from above, for electromagnetic coupling with the coil electrode 301. With such an arrangement, the balanced-side inductor L2 and the unbalanced-side inductor L1 provide a mutual inductor M.

A plate electrode 501 having a substantially rectangular shape, as viewed from above, is provided on the dielectric layer 105. The plate electrode 501 is connected to the unbalanced terminal Punb on the first lateral surface and is connected, as described above, to the other end of the coil electrode 402A through the via electrode VH45. The plate electrode 501 corresponds to one of opposed electrodes of the unbalanced-side capacitor C1.

Plate electrodes 601 and 602, each having a substantially rectangular shape as viewed from above, are provided on the dielectric layer 106. The plate electrode 602 is arranged in opposing relation to the plate electrode 501 on the dielectric layer 105 in the stacking direction. With such an arrangement, the plate electrode 602 serves as the other of the opposed electrodes of the unbalanced-side capacitor C1. Thus, the plate electrodes 501 and 602 and the dielectric layer 105 constitute the unbalanced-side capacitor C1.

The plate electrode 602 is connected to the ground terminal GND on the first lateral surface and to the ground terminal GND at the center of the second lateral surface. As a result, the resonance circuit including the unbalanced-side capacitor C1 and the unbalanced-side inductor L1 is provided.

The plate electrode 601 is arranged to define a floating electrode that is not connected to any outer terminals including the ground terminals GND.

Plate electrodes 701 and 702, each having a substantially rectangular shape as viewed from above, are provided on the dielectric layer 107. The plate electrode 701 is arranged in opposing relation to the plate electrode 601 on the dielectric layer 106 in the stacking direction. With such an arrangement, the first balanced-side capacitor C2 is provided by the plate electrodes 601 and 701 with the dielectric layer 106 interposed therebetween. The plate electrode 701 is connected to the first balanced terminal Pb1 on the first lateral surface.

The plate electrode 702 is also arranged in opposing relation to the plate electrode 601 on the dielectric layer 106 in the stacking direction. With such an arrangement, the second balanced-side capacitor C3 is provided by the plate electrodes 601 and 702 with the dielectric layer 106 interposed therebetween. The plate electrode 702 is connected to the second balanced terminal Pb2 on the second lateral surface.

The multilayer filter 10 having the circuit configuration, illustrated in FIG. 1, can be realized with the laminate 100 having the above-described structure.

Further, since one in the pair of the opposed electrodes constituting each of the first balanced-side capacitor C2 and the second balanced-side capacitor C3 is, as described above, provided by the inner-layer plate electrode 601 that is not connected to the ground terminals GND, phase balance between the balanced terminals is not affected by the ground wiring pattern on the mother board and the mounted state of the multilayer filter. As a result, the multilayer filter having stable phase balance can be obtained.

Moreover, by using one in the pair of opposed electrodes constituting each of the first balanced-side capacitor C2 and the second balanced-side capacitor C3 in a shared manner, a wiring pattern between the first balanced-side capacitor C2 and the second balanced-side capacitor C3 can be omitted. Therefore, more stable phase balance can be realized and the size of the multilayer filter can be further reduced.

Figure 4:
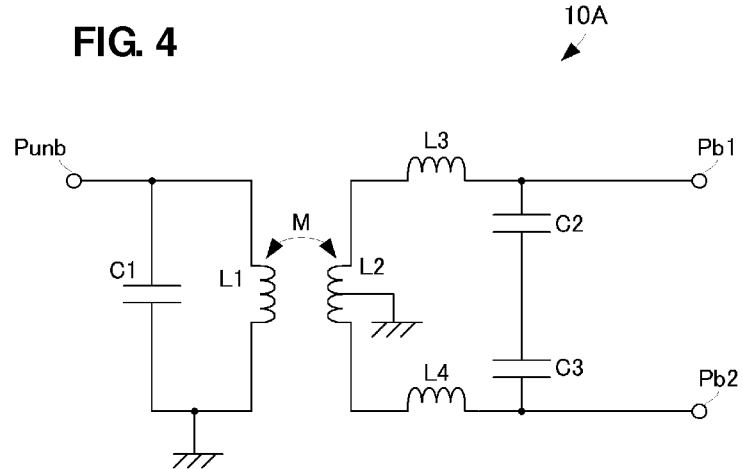
FIG. 4 is a circuit diagram of a multilayer filter according to a second preferred embodiment of the present invention.

A multilayer filter according to a second preferred embodiment will be described below with reference to the drawings. FIG. 4 is a circuit diagram of a multilayer filter 10A according to the second preferred embodiment. As illustrated in FIG. 4, the multilayer filter 10A of the second preferred embodiment differs from the multilayer filter 10 of the first preferred embodiment in that a predetermined point of the balanced-side inductor L2 is connected to the ground in the above-described circuit configuration. The arrangement of outer terminals in the multilayer filter 10A of the second preferred embodiment is similar to that in the multilayer filter 10 of the first preferred embodiment. Hence, the description of the circuit configuration and the arrangement of the outer terminals is omitted here.

Figure 5:
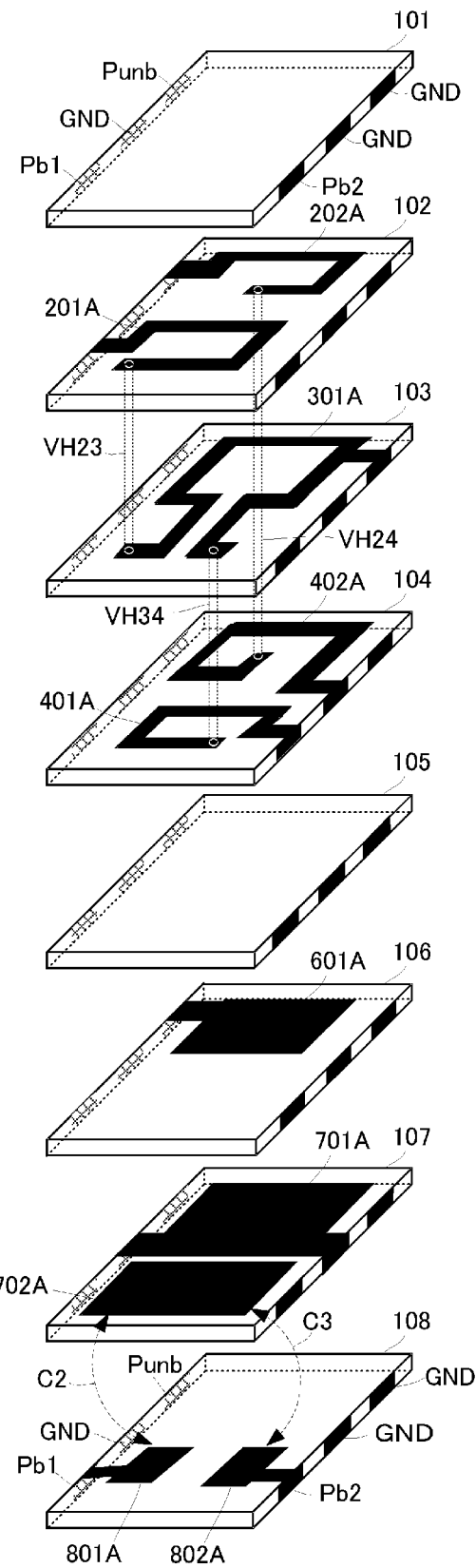
FIG. 5 is an exploded perspective view of the multilayer filter according to the second preferred embodiment of the present invention.

FIG. 5 is an exploded perspective view of the multilayer filter 10A according to the second preferred embodiment. The multilayer filter 10A preferably includes eight dielectric layers 101 to 108, for example, stacked on each other. The dielectric layer 101 as an uppermost layer preferably has the same structure as that in the multilayer filter 10 of the first preferred embodiment.

Coil electrodes 201A and 202A are provided on the dielectric layer 102. One end of the coil electrode 201A is connected to the first balanced terminal Pb1 on the first lateral surface. The coil electrode 201A preferably has a coiled shape, as viewed from above, starting from the one end thereof. The other end of the coil electrode 201A is connected to one end of a coil electrode 301A on the dielectric layer 103 through an electroconductive via electrode VH23. The coil electrode 201A constitutes the balanced-side inductor L3.

One end of the coil electrode 202A is connected to the unbalanced terminal Punb on the first lateral surface. The coil electrode 202A preferably has a coiled shape, as viewed from above, starting from the one end thereof. The other end of the coil electrode 202A is connected to one end of a coil electrode 402A on the dielectric layer 104 through an electroconductive via electrode VH24.

The coil electrode 202A is located at a position where at least a portion thereof overlaps with the coil electrode 301A on the dielectric layer 103, when looking at a laminate from above, for electromagnetic coupling with the coil electrode 301A.

The coil electrode 301A is provided on the dielectric layer 103. The one end of the coil electrode 301A is, as described above, connected to the other end of the coil electrode 201A through the via electrode VH23.

The coil electrode 301A preferably has a coiled shape extending substantially over an entire surface of the dielectric layer 103, starting from the one end thereof. The other end of the coil electrode 301A is connected to one end of a coil electrode 401A on the dielectric layer 104 through an electroconductive via electrode VH34. The coil electrode 301A constitutes the balanced-side inductor L2.

In addition, the coil electrode 301A is connected at a predetermined position along the coiled shape thereof to the ground terminal GND at an end of the second lateral surface. The predetermined point of the balanced-side inductor L2 is thereby connected to the ground. Since the balanced-side inductor L2 is grounded, phase balance of the balanced signals becomes more stable.

The coil electrodes 401A and 402A are provided on the dielectric layer 104. The one end of the coil electrode 401A is, as described above, connected to the other end of the coil electrode 301A through the via electrode VH34.

The coil electrode 401A preferably has a coiled shape, starting from the one end thereof. The coil electrode 401A is arranged to extend in the same winding direction as the coil electrode 201A, when looking at the laminate from above. The other end of the coil electrode 401A is connected to the second balanced terminal Pb2 on the second lateral surface. The coil electrode 401A constitutes the balanced-side inductor L4.

The one end of the coil electrode 402A is, as described above, connected to the other end of the coil electrode 202A through the via electrode VH24. The coil electrode 402A preferably has a coiled shape, starting from the one end thereof. The coil electrode 402A is arranged to extend in the same winding direction as the coil electrode 202A, when looking at the laminate from above. The other end of the coil electrode 402A is connected to the ground terminal GND at a center of the second lateral surface. The coil electrode 202A, the via electrode VH24, and the coil electrode 402A constitute the unbalanced-side inductor L1.

Like the coil electrode 202A, the coil electrode 402A is also located at a position where at least a portion thereof overlaps with the coil electrode 301A, as viewed from above, for electromagnetic coupling with the coil electrode 301A. With such an arrangement, the balanced-side inductor L2 and the unbalanced-side inductor L1 provide the mutual inductor M. In this second preferred embodiment, since the coil electrode 301A is sandwiched between the coil electrode 202A and the coil electrode 402A in the stacking direction, the mutual inductor M between the balanced-side inductor L2 and the unbalanced-side inductor L1 can be increased. No patterns for the inner layer electrodes are provided on the dielectric layer 105.

A plate electrode 601A preferably having a substantially rectangular shape, as viewed from above, is provided on the dielectric layer 106. The plate electrode 601A is located in a region on the same side as the regions where the coil electrodes 202A and 402A constituting the unbalanced-side inductor L1 are located, when looking at the laminate 100A from above, i.e., in a region overlapping with the coil electrode 202A and 402A as viewed from above. The plate electrode 601A corresponds to one of opposed electrodes of the unbalanced-side capacitor C1.

Plate electrodes 701A and 702A, each having a substantially rectangular shape as viewed from above, are provided on the dielectric layer 107. The plate electrode 701A is located at a position opposite to the plate electrode 601A in the stacking direction. With such an arrangement, the plate electrode 701A serves as the other of the opposed electrodes of the unbalanced-side capacitor C1. Thus, the plate electrodes 601A and 701A and the dielectric layer 106 constitute the unbalanced-side capacitor C1. The plate electrode 701A is connected to the ground terminal GND on the first lateral surface and to the ground terminal GND at the center of the second lateral surface. As a result, the resonance circuit including the unbalanced-side capacitor C1 and the unbalanced-side inductor L1 is provided.

The plate electrode 702A is arranged to define a floating electrode that is not connected to any outer terminals including the ground terminals GND.

Plate electrodes 801A and 802A, each having a substantially rectangular shape as viewed from above, are provided on the dielectric layer 108. The plate electrode 801A is arranged in opposing relation to the plate electrode 702A in the stacking direction. With such an arrangement, the first balanced-side capacitor C2 is provided by the plate electrodes 801A and 702A with the dielectric layer 107 interposed therebetween. The plate electrode 801A is connected to the first balanced terminal Pb1 on the first lateral surface.

The plate electrode 802A is also arranged in opposing relation to the plate electrode 702A in the stacking direction. With such an arrangement, the second balanced-side capacitor C3 is provided by the plate electrodes 802A and 702A with the dielectric layer 107 interposed therebetween. The plate electrode 802A is connected to the second balanced terminal Pb2 on the second lateral surface.

Thus, the multilayer filter 10A having the circuit configuration, illustrated in FIG. 4, can be realized with the laminate. Further, by using the structure illustrated in FIG. 5, the multilayer filter 10A having stable phase balance can be obtained as in the first preferred embodiment.

A multilayer filter according to a third preferred embodiment will be described below with reference to the drawings. A multilayer filter 10B of the third preferred embodiment preferably has the same circuit configuration as that of the multilayer filter 10A of the second preferred embodiment, and hence the description of the circuit configuration of the multilayer filter 10B is omitted.

Figure 6:
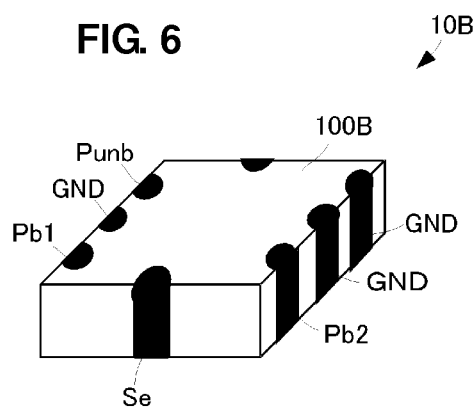
FIG. 6 is an external perspective view of a multilayer filter according to a third preferred embodiment of the present invention.
Figure 7:
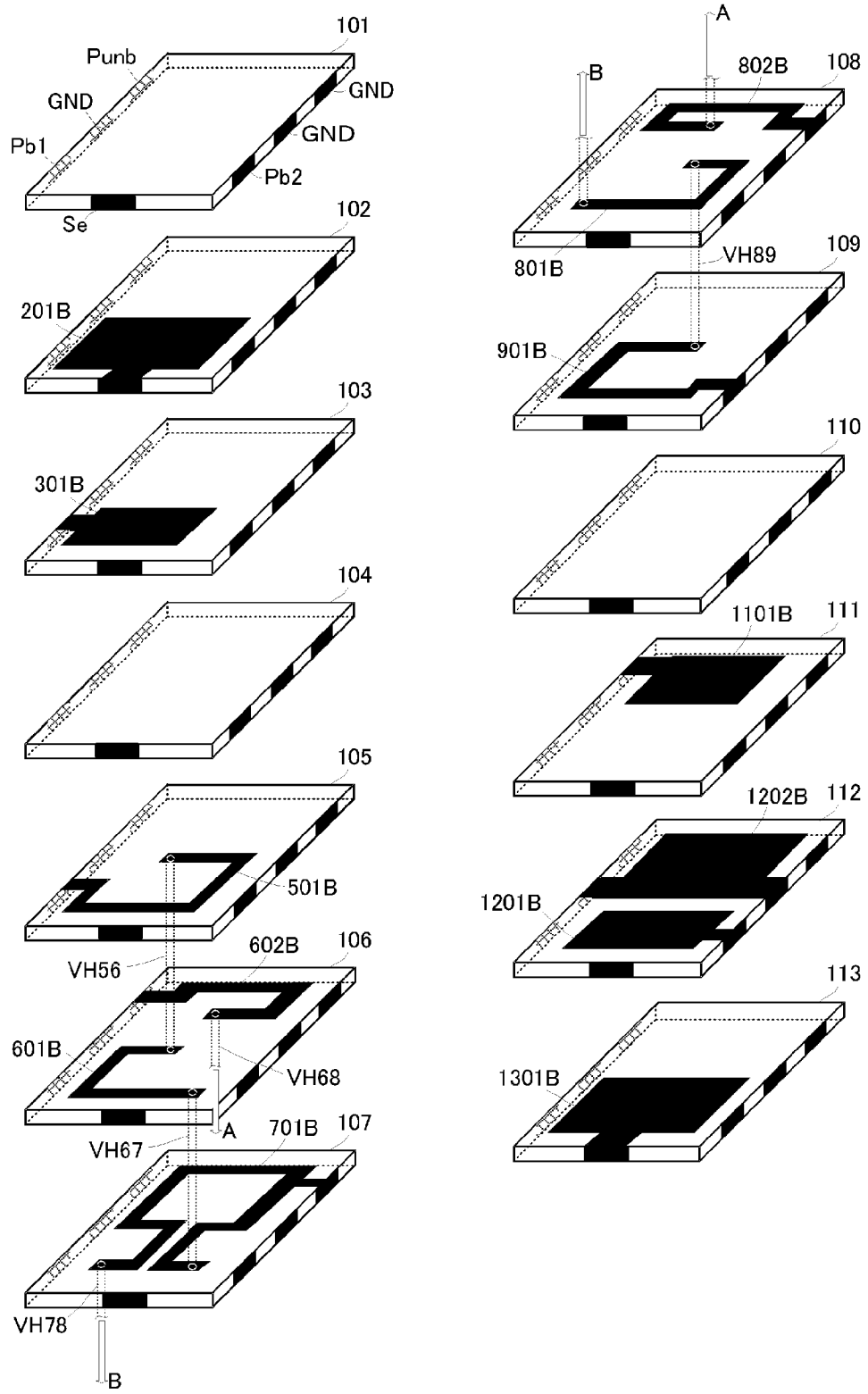
FIG. 7 is an exploded perspective view of the multilayer filter according to the third preferred embodiment of the present invention.

FIG. 6 is an external perspective view of the multilayer filter 10B according to the third preferred embodiment, and FIG. 7 is an exploded perspective view of the multilayer filter 10B according to the third preferred embodiment.

The multilayer filter 10B is realized with a laminate 100B that includes thirteen dielectric layers 101 to 113, for example, stacked on each other.

As illustrated in FIG. 6, the laminate 100B preferably is substantially parallelepiped in its external shape. An unbalanced terminal Punb, a ground terminal GND, and a first balanced terminal Pb1 are located on a first lateral surface of the laminate 100B and are arranged in the order named. Two ground terminals GND and a second balanced terminal Pb2 are located on a second lateral surface of the laminate 100B, which is positioned opposite to the first lateral surface thereof, and are arranged in the order named. In such a structure, the first balanced terminal Pb1 and the second balanced terminal Pb2 are arranged opposite to each other. Further, a connection electrode Se is provided on each of third and fourth lateral surfaces that are perpendicular to the first and second lateral surfaces. The connection electrode Se is a pattern that is used to connect predetermined inner layer electrodes (described later) to each other and that is not connected to any patterns for functional circuits on a mother board to which the multilayer filter 10B is mounted.

Only the above-mentioned group of outer terminals and a marking electrode are provided on the dielectric layer 101.

A plate electrode 201B having a substantially rectangular shape, as viewed from above, is provided on the dielectric layer 102. The plate electrode 201B is provided on the dielectric layer 102 over a predetermined area (about a half the surface of the dielectric layer 102 in the illustrated example) in a region on the side closer to the first balanced terminal Pb1 and the second balanced terminal Pb2. The plate electrode 201B is connected to the connection electrode Se.

A plate electrode 301B having a substantially rectangular shape, as viewed from above, is provided on the dielectric layer 103. The plate electrode 301B is located at a position opposite to the plate electrode 201B in the stacking direction. The plate electrode 301B is connected to the first balanced terminal Pb1 on the first lateral surface.

The plate electrode 201B on the dielectric layer 102, the plate electrode 301B on the dielectric layer 103, and the dielectric layer 102 interposed between the plate electrodes 201B and 301B constitute the first balanced-side capacitor C2. No patterns for the inner layer electrodes are provided on the dielectric layer 104.

A coil electrode 501B is provided on the dielectric layer 105. One end of the coil electrode 501B is connected to the first balanced terminal Pb1 on the first lateral surface. The coil electrode 501B preferably has a coiled shape, as viewed from above, starting from the one end thereof. The other end of the coil electrode 501B is connected to one end of a coil electrode 601B on the dielectric layer 106 through an electroconductive via electrode VH56.

Coil electrodes 601B and 602B are provided on the dielectric layer 106. The one end of the coil electrode 601B is, as described above, connected to the other end of the coil electrode 501B through the via electrode VH56. The coil electrode 601B preferably has a coiled shape, as viewed from above, starting from the one end thereof. The coil electrode 601B is arranged to extend in the same winding direction as the coil electrode 501B. The coil electrodes 501B and 601B and the via electrode VH56 constitute the balanced-side inductor L3.

The other end of the coil electrode 601B is connected to one end of a coil electrode 701B on the dielectric layer 107 through an electroconductive via electrode VH67.

One end of the coil electrode 602B is connected to the unbalanced terminal Punb on the first lateral surface. The coil electrode 602B preferably has a coiled shape, as viewed from above, starting from the one end thereof. The other end of the coil electrode 602B is connected to one end of a coil electrode 802B on the dielectric layer 108 through an electroconductive via electrode VH68.

For electromagnetic coupling with the coil electrode 701B on the dielectric layer 107, the coil electrode 602B is located at a position where at least a portion thereof overlaps with the coil electrode 701B, when looking at the laminate from above.

The coil electrode 701B is provided on the dielectric layer 107. The one end of the coil electrode 701B is, as described above, connected to the other end of the coil electrode 601B through the via electrode VH67. The coil electrode 701B preferably has a coiled shape extending substantially over an entire surface of the dielectric layer 107, starting from the one end thereof. The other end of the coil electrode 701B is connected to one end of a coil electrode 801B on the dielectric layer 108 through an electroconductive via electrode VH78. The coil electrode 701B constitutes the balanced-side inductor L2.

In addition, the coil electrode 701B is connected at a predetermined position along the coiled shape thereof to the ground terminal GND at an end of the second lateral surface. The predetermined point of the balanced-side inductor L2 is thereby connected to the ground.

The coil electrodes 801B and 802B are provided on the dielectric layer 108. The one end of the coil electrode 802B is, as described above, connected to the other end of the coil electrode 602B through the via electrode VH68. The coil electrode 802B preferably has a coiled shape, starting from the one end thereof. The coil electrode 802B is arranged to extend in the same winding direction as the coil electrode 602B, when looking at the laminate 100B from above. The other end of the coil electrode 802B is connected to the ground terminal GND at the end of the second lateral surface. The coil electrode 602B, the via electrode VH68, and the coil electrode 802B constitute the unbalanced-side inductor L1.

Like the coil electrode 602B, the coil electrode 802B is also located at a position where at least a portion thereof overlaps with the coil electrode 701B, when looking at the laminate from above, for electromagnetic coupling with the coil electrode 701B. With such an arrangement, the balanced-side inductor L2 and the unbalanced-side inductor L1 provide a mutual inductor M. In this third preferred embodiment, since the coil electrode 701B is sandwiched between the coil electrode 602B and the coil electrode 802B in the stacking direction, the mutual inductor M between the balanced-side inductor L2 and the unbalanced-side inductor L1 can be increased.

The one end of the coil electrode 801B is, as described above, connected to the other end of the coil electrode 701B through the via electrode VH78. The coil electrode 801B preferably has a coiled shape, starting from the one end thereof. The coil electrode 801B is arranged to extend in the same winding direction as the coil electrodes 501B and 601B, when looking at the laminate 100B from above. The other end of the coil electrode 801B is connected to one end of a coil electrode 901B on the dielectric layer 109 through a via electrode VH89.

The coil electrode 901B is provided on the dielectric layer 109. The one end of the coil electrode 901B is, as described above, connected to the other end of the coil electrode 801B through the via electrode VH89. The coil electrode 901B preferably has a coiled shape, starting from the one end thereof. The coil electrode 901B is arranged to extend in the same winding direction as the coil electrode 801B, when looking at the laminate 100B from above. The other end of the coil electrode 901B is connected to the second balanced terminal Pb2 on the second lateral surface. The coil electrode 801B, the via electrode VH89, and the coil electrode 901B constitute the balanced-side inductor L4.

No patterns for the inner layer electrodes are provided on the dielectric layer 110.

A plate electrode 1101B having a substantially rectangular shape, as viewed from above, is provided on the dielectric layer 111. The plate electrode 1101B is located in a region on the same side as the regions where the coil electrodes 602B and 802B constituting the unbalanced-side inductor L1 are located, when looking at the laminate 100B from above, i.e., in a region overlapping with the coil electrodes 602B and 802B as viewed from above.

Plate electrodes 1201B and 1202B, each having a substantially rectangular shape as viewed from above, are provided on the dielectric layer 112. The plate electrode 1202B is located at a position opposite to the plate electrode 1101B in the stacking direction. With such an arrangement, the plate electrodes 1202B and 1101B and the dielectric layer 111 constitute the unbalanced-side capacitor C1. The plate electrode 1202B is connected to the ground terminal GND on the first lateral surface and to the ground terminal GND at a center of the second lateral surface. As a result, a resonance circuit including the unbalanced-side capacitor C1 and the unbalanced-side inductor L1 is provided.

The plate electrode 1201B is located in a region on the same side as the regions where the coil electrodes 501B, 601B, 801B and 901B constituting the balanced-side inductors L3 and L4 are located, when looking at the laminate 100B from above, i.e., in a region overlapping with the coil electrodes 501B, 601B, 801B and 901B as viewed from above. The plate electrode 1201B is connected to the second balanced terminal Pb2 on the second lateral surface.

A plate electrode 1301B having a substantially rectangular shape, as viewed from above, is provided on the dielectric layer 113. The plate electrode 1301B is arranged in opposing relation to the plate electrode 1201B in the stacking direction. The plate electrode 1301B is connected to the connection electrode Se.

The plate electrode 1201B on the dielectric layer 112, the plate electrode 1301B on the dielectric layer 113, and the dielectric layer 112 interposed between the plate electrodes 1201B and 1301B constitute the second balanced-side capacitor C3.

In the above-described arrangement, the plate electrode 201B of the first balanced-side capacitor C2 and the plate electrode 1301B of the second balanced-side capacitor C3 are connected to each other by the connection electrode Se and they are not connected to the ground terminals GND. Thus, each of the plate electrodes 201B and 1301B defines a floating electrode that is not connected to the ground terminal GND. As a result, this third preferred embodiment can also provide the multilayer filter 10B having the stable balance characteristic as in the above-described first preferred embodiment.

Further, since the first balanced-side capacitor C2 and the second balanced-side capacitor C3 are located to be aligned in the stacking direction in this third preferred embodiment, the size of the multilayer filter in its plan shape can be reduced in comparison with that in the above-described Preferred embodiments when the first balanced-side capacitor C2 and the second balanced-side capacitor C3 are set to the same capacitances as those in the above-described preferred embodiments. Stated another way, when the multilayer filter preferably has a plan shape having the same size, larger capacitances can be realized with the third preferred embodiment.

Moreover, since the first balanced-side capacitor C2 and the second balanced-side capacitor C3 are arranged with the unbalanced-side inductor L1 and the balanced-side inductors L2, L3 and L4 interposed therebetween in the stacking direction, a more stable balance characteristic can be obtained.

A multilayer filter according to a fourth preferred embodiment will be described below with reference to the drawings. A multilayer filter 10C of this fourth preferred embodiment is provided by adding a DC feed terminal to the multilayer filter 10 of the first preferred embodiment.

Figure 8:
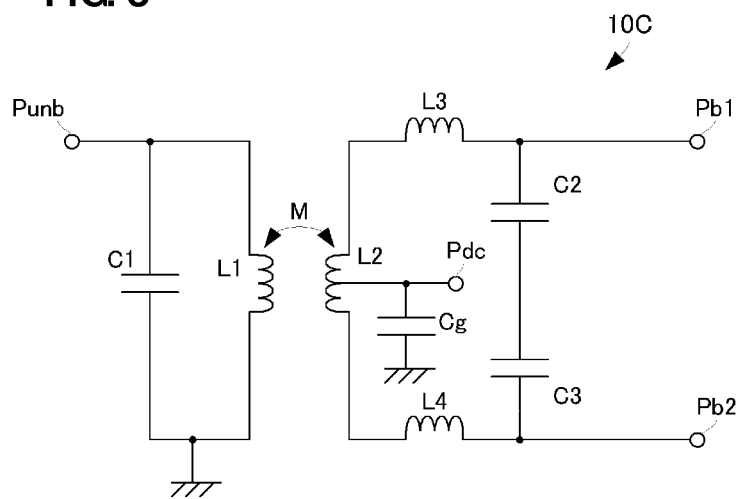
FIG. 8 is a circuit diagram of a multilayer filter according to a fourth preferred embodiment of the present invention.

FIG. 8 is a circuit diagram of the multilayer filter 10C according to the fourth preferred embodiment. In the multilayer filter 10C, as illustrated in FIG. 8, a DC feed terminal Pdc is connected to a midpoint of the balanced-side inductor L2. A line connecting the DC feed terminal Pdc and the balanced-side inductor L2 is connected to the ground through a capacitor Cg. The other arrangement is similar to that in the multilayer filter 10 of the first preferred embodiment, and hence the detailed description of the circuit configuration is omitted here.

Figure 9:
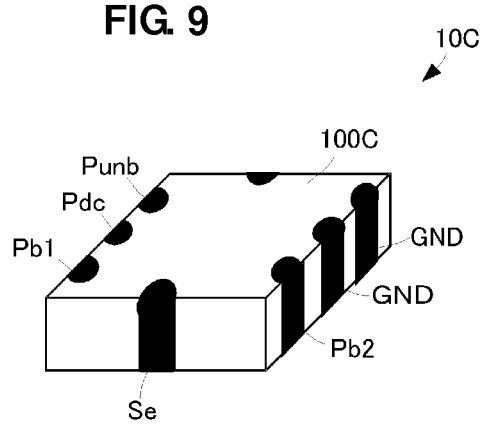
FIG. 9 is an external perspective view of the multilayer filter according to the fourth preferred embodiment of the present invention.

FIG. 9 is an external perspective view of the multilayer filter 10C according to the fourth preferred embodiment. As illustrated in FIG. 9, a laminate 100C constituting the multilayer filter 10C is substantially parallelepiped in its external shape. An unbalanced terminal Punb, an outer electrode for the DC feed terminal Pdc (the outer electrode being also hereinafter referred to as the "DC feed terminal Pdc"), and a first balanced terminal Pb1 are located on a first lateral surface of the laminate 100C and are arranged in the order named. Two ground terminals GND and a second balanced terminal Pb2 are located on a second lateral surface of the laminate 100C, which is positioned opposite to the first lateral surface thereof, and are arranged in the order named. In such a structure, the first balanced terminal Pb1 and the second balanced terminal Pb2 are arranged opposite to each other. Further, a connection electrode Se is provided on each of third and fourth lateral surfaces that are perpendicular to the first and second lateral surfaces. The connection electrode Se is a pattern that is used to connect predetermined inner layer electrodes (described later) to each other and that is not connected to any patterns for functional circuits on a mother board to which the multilayer filter 10C is mounted.

Figure 10:
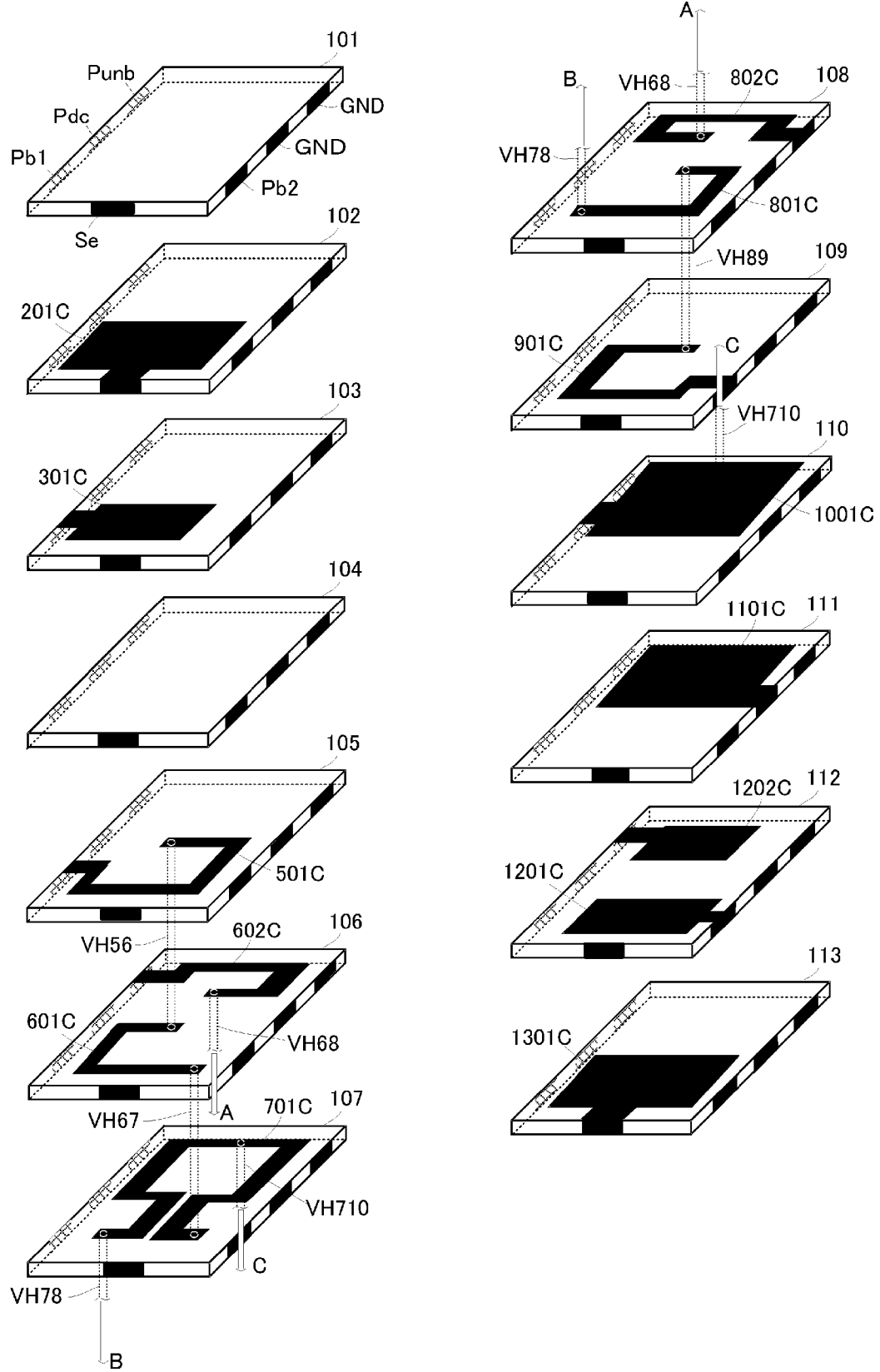
FIG. 10 is an exploded perspective view of the multilayer filter according to the fourth preferred embodiment of the present invention.

FIG. 10 is an exploded perspective view of the multilayer filter 10C according to the fourth preferred embodiment. The multilayer filter 10C is realized with the laminate 100C that includes thirteen dielectric layers 101 to 113, for example, stacked on each other.

Only the above-mentioned group of outer terminals and a marking electrode are provided on the dielectric layer 101.

A plate electrode 201C having a substantially rectangular shape, as viewed from above, is provided on the dielectric layer 102. The plate electrode 201C is provided on the dielectric layer 102 over a predetermined area (about a half the surface of the dielectric layer 102 in the illustrated example) in a region on the side closer to the first balanced terminal Pb1 and the second balanced terminal Pb2. The plate electrode 201C is connected to the connection electrode Se.

A plate electrode 301C having a substantially rectangular shape, as viewed from above, is provided on the dielectric layer 103. The plate electrode 301C is located at a position opposite to the plate electrode 201C in the stacking direction. The plate electrode 301C is connected to the first balanced terminal Pb1 on the first lateral surface.

The plate electrode 201C on the dielectric layer 102, the plate electrode 301C on the dielectric layer 103, and the dielectric layer 102 interposed between the plate electrodes 201C and 301C constitute the first balanced-side capacitor C2.

No patterns for the inner layer electrodes are provided on the dielectric layer 104.

A coil electrode 501C is provided on the dielectric layer 105. One end of the coil electrode 501C is connected to the first balanced terminal Pb1 on the first lateral surface. The coil electrode 501C preferably has a coiled shape, as viewed from above, starting from the one end thereof. The other end of the coil electrode 501C is connected to one end of a coil electrode 601C on the dielectric layer 106 through an electroconductive via electrode VH56.

Coil electrodes 601C and 602C are provided on the dielectric layer 106. The one end of the coil electrode 601C is, as described above, connected to the other end of the coil electrode 501C through the via electrode VH56. The coil electrode 601C preferably has a coiled shape, as viewed from above, starting from the one end thereof. The coil electrode 601C is arranged to extend in the same winding direction as the coil electrode 501C. The coil electrodes 501C and 601C and the via electrode VH56 constitute the balanced-side inductor L3.

The other end of the coil electrode 601C is connected to one end of a coil electrode 701C on the dielectric layer 107 through an electroconductive via electrode VH67.

One end of the coil electrode 602C is connected to the unbalanced terminal Punb on the first lateral surface. The coil electrode 602C preferably has a coiled shape, as viewed from above, starting from the one end thereof. The other end of the coil electrode 602C is connected to one end of a coil electrode 802C on the dielectric layer 108 through an electroconductive via electrode VH68.

The coil electrode 602C is located at a position where at least a portion thereof overlaps with the coil electrode 701C on the dielectric layer 107, when looking at the laminate from above, for electromagnetic coupling with the coil electrode 701C.

The coil electrode 701C is provided on the dielectric layer 107. The one end of the coil electrode 701C is, as described above, connected to the other end of the coil electrode 601C through the via electrode VH67. The coil electrode 701C preferably has a coiled shape substantially over an entire surface of the dielectric layer 107, starting from the one end thereof. The other end of the coil electrode 701C is connected to one end of a coil electrode 801C on the dielectric layer 108 through an electroconductive via electrode VH78. The coil electrode 701C constitutes the balanced-side inductor L2.

Further, the coil electrode 701C is connected at a predetermined position along the winding direction thereof to a plate electrode 1001C on the dielectric layer 110 through a via electrode VH710.

The coil electrodes 801C and 802C are provided on the dielectric layer 108. The one end of the coil electrode 802C is, as described above, connected to the other end of the coil electrode 602C through the via electrode VH68. The coil electrode 802C preferably has a coiled shape, starting from the one end thereof. The coil electrode 802C is arranged to extend in the same winding direction as the coil electrode 602C, when looking at the laminate 100C from above. The other end of the coil electrode 802C is connected to the ground terminal GND at an end of the second lateral surface. The coil electrode 602C, the via electrode VH68, and the coil electrode 802C constitute the unbalanced-side inductor L1.

Like the coil electrode 602C, the coil electrode 802C is also located at a position where at least a portion thereof overlaps with the coil electrode 701C, when looking at a laminate from above, for electromagnetic coupling with the coil electrode 701C. With such an arrangement, the balanced-side inductor L2 and the unbalanced-side inductor L1 provide a mutual inductor M. In this fourth preferred embodiment, since the coil electrode 701C is sandwiched between the coil electrode 602C and the coil electrode 802C in the stacking direction, the mutual inductor M between the balanced-side inductor L2 and the unbalanced-side inductor L1 can be increased.

The one end of the coil electrode 801C is, as described above, connected to the other end of the coil electrode 701C through the via electrode VH78. The coil electrode 801C preferably has a coiled shape, starting from the one end thereof. The coil electrode 801C is arranged to extend in the same winding direction as the coil electrodes 501C and 601C, when looking at the laminate 100C from above. The other end of the coil electrode 801C is connected to one end of a coil electrode 901C on the dielectric layer 109 through a via electrode VH89.

The coil electrode 901C is provided on the dielectric layer 109. The one end of the coil electrode 901C is, as described above, connected to the other end of the coil electrode 801C through the via electrode VH89. The coil electrode 901C preferably has a coiled shape, starting from the one end thereof. The coil electrode 901C is arranged to extend in the same winding direction as the coil electrode 801C, when looking at the laminate 100C from above. The other end of the coil electrode 901C is connected to the second balanced terminal Pb2 on the second lateral surface. The coil electrode 801C, the via electrode VH89, and the coil electrode 901C constitute the balanced-side inductor L4.

A plate electrode 1001C having a substantially rectangular shape, as viewed from above, is provided on the dielectric layer 110. The plate electrode 1001C is located in a region on the same side as the regions where the coil electrodes constituting the unbalanced-side inductor L1 are located, when looking at the laminate 100C from above. The plate electrode 1001C is connected to the DC feed terminal Pdc on the first lateral surface.

A plate electrode 1101C having a substantially rectangular shape, as viewed from above, is provided on the dielectric layer 111. The plate electrode 1101C is located in a region on the same side as the regions where the coil electrodes constituting the unbalanced-side inductor L1 are located, when looking at the laminate 100C from above. The plate electrode 1101C is located at a position opposite to the plate electrode 1001C in the stacking direction. The plate electrodes 1001C and 1101C and the dielectric layer 110 constitute the capacitor Cg for protecting the DC feed terminal Pdc. The capacitor Cg can remove high-frequency components of a signal passing through the DC feed terminal Pdc.

Plate electrodes 1201C and 1202C, each having a substantially rectangular shape as viewed from above, are provided on the dielectric layer 112. The plate electrode 1202C is located at a position opposite to the plate electrode 1101C in the stacking direction. With such an arrangement, the plate electrodes 1202C and 1101C and the dielectric layer 111 constitute the unbalanced-side capacitor C1. The plate electrode 1202C is connected to the unbalanced terminal Punb on the first lateral surface. The resonance circuit including the unbalanced-side capacitor C1 and the unbalanced-side inductor L1 is thus constituted.

The plate electrode 1201C is located in a region on the same side as the regions where the coil electrodes constituting the balanced-side inductors L3 and L4 are located, when looking at the laminate 100C from above. The plate electrode 1201C is connected to the second balanced terminal Pb2 on the second lateral surface.

A plate electrode 1301C having a substantially rectangular shape, as viewed from above, is provided on the dielectric layer 113. The plate electrode 1301C is arranged in opposing relation to the plate electrode 1201C in the stacking direction. The plate electrode 1301C is connected to the connection electrode Se.

The plate electrode 1201C on the dielectric layer 112, the plate electrode 1301C on the dielectric layer 113, and the dielectric layer 112 interposed between the plate electrodes 1201C and 1301C constitute the second balanced-side capacitor C3.

With the arrangement described above, the fourth preferred embodiment including the DC feed terminal Pdc can also provide similar advantageous effects in operation to those in the above-described third preferred embodiment.

A multilayer filter according to a fifth preferred embodiment will be described below with reference to the drawings. While the above-described preferred embodiments represent the case where one balance filter circuit is preferably provided in one laminate, the following preferred embodiments represent the case where two balance filter circuits are located in one laminate.

Figure 11:
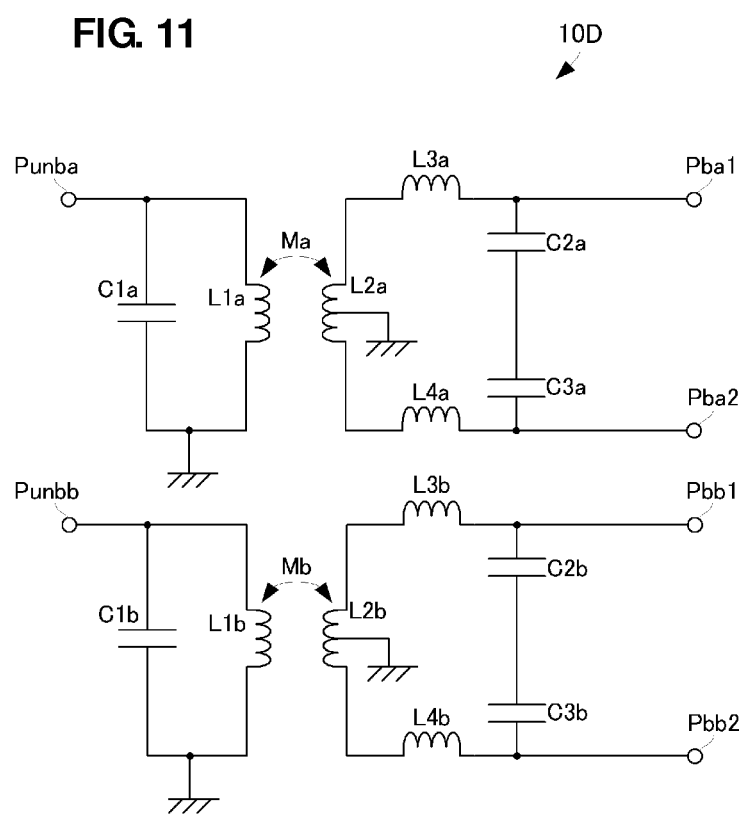
FIG. 11 is a circuit diagram of a multilayer filter according to a fifth preferred embodiment of the present invention.

FIG. 11 is a circuit diagram of a multilayer filter 10D according to the fifth preferred embodiment. As illustrated in FIG. 11, in the multilayer filter 10D of the fifth preferred embodiment, two filter circuits of the second preferred embodiment, illustrated in FIG. 4, are preferably provided in one laminate.

A first filter circuit constituting the multilayer filter 10D includes an unbalanced terminal Punba to input and to output an unbalanced signal, and a first balanced terminal Pba1 and a second balanced terminal Pba2 to input and to output balanced signals.

A parallel resonance circuit including an unbalanced-side capacitor C1a and an unbalanced-side inductor L1a is connected between the unbalanced terminal Punba and the ground.

Three balanced-side inductors L3a, L2a and L4a are connected in series between the first balanced terminal Pba1 and the second balanced terminal Pba2. The balanced-side inductors L3a, L2a and L4a are connected in the order named, i.e., in the order of the balanced-side inductors L3a, L2a and L4a, looking from the first balanced terminal Pba1. As described later, the balanced-side inductors L3a, L2a and L4a are provided by substantially helical coils having the same winding direction. While three balanced-side inductors are preferably included in the illustrated preferred embodiment, the number of balanced-side inductors may be some other suitable value as long as it is an odd number other than one.

The balanced-side inductor L2a is arranged to be electromagnetically coupled with the unbalanced-side inductor L1a. Such an arrangement causes a mutual inductor Ma to act between the balanced-side inductor L2a and the unbalanced-side inductor L1a. The balanced-side inductor L2a is connected at a predetermined point thereof to the ground. Thus, since the balanced-side inductor L2a is grounded, phase balance of the balanced signals becomes more stable.

A serial circuit including a first balanced-side capacitor C2a and a second balanced-side capacitor C3a is connected between the first balanced terminal Pba1 and the second balanced terminal Pba2. The first balanced-side capacitor C2a and the second balanced-side capacitor C3a are connected in the order named, i.e., in the order of the first and second balanced-side capacitor C2a and C3a, looking from the first balanced terminal Pba1.

A second filter circuit constituting the multilayer filter 10D includes an unbalanced terminal Punbb to input and to output an unbalanced signal, and a first balanced terminal Pbb1 and a second balanced terminal Pbb2 to input and to output balanced signals.

A parallel resonance circuit including an unbalanced-side capacitor C1b and an unbalanced-side inductor L1b is connected between the unbalanced terminal Pbnbb and the ground.

Three balanced-side inductors L3b, L2b and L4b are connected in series between the first balanced terminal Pbb1 and the second balanced terminal Pbb2. The balanced-side inductors L3b, L2b and L4b are connected in the order named, i.e., in the order of the balanced-side inductors L3b, L2b and L4b, looking from the first balanced terminal Pbb1. As described later, the balanced-side inductors L3b, L2b and L4b are provided by substantially helical coils having the same winding direction. While three balanced-side inductors are preferably included in the illustrated preferred embodiment, the number of balanced-side inductors may be some other suitable value as long as it is an odd number other than one.

The balanced-side inductor L2b is arranged to be electromagnetically coupled with the unbalanced-side inductor L1b. Such an arrangement causes a mutual inductor Mb to act between the balanced-side inductor L2b and the unbalanced-side inductor L1b. The balanced-side inductor L2b is connected at a predetermined point thereof to the ground.

A serial circuit including a first balanced-side capacitor C2b and a second balanced-side capacitor C3b is connected between the first balanced terminal Pbb1 and the second balanced terminal Pbb2. The first balanced-side capacitor C2b and the second balanced-side capacitor C3b are connected in the order named, i.e., in the order of the first and second balanced-side capacitor C2b and C3b, looking from the first balanced terminal Pbb1.

Figure 12:
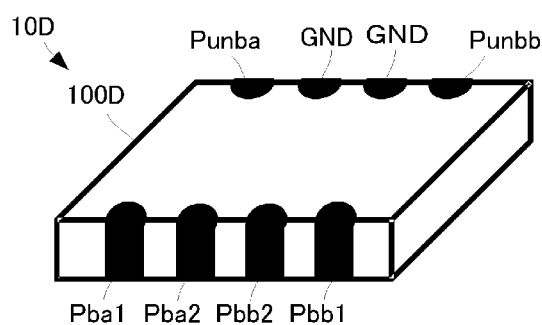
FIG. 12 is an external perspective view of the multilayer filter according to the fifth preferred embodiment of the present invention.
Figure 13:
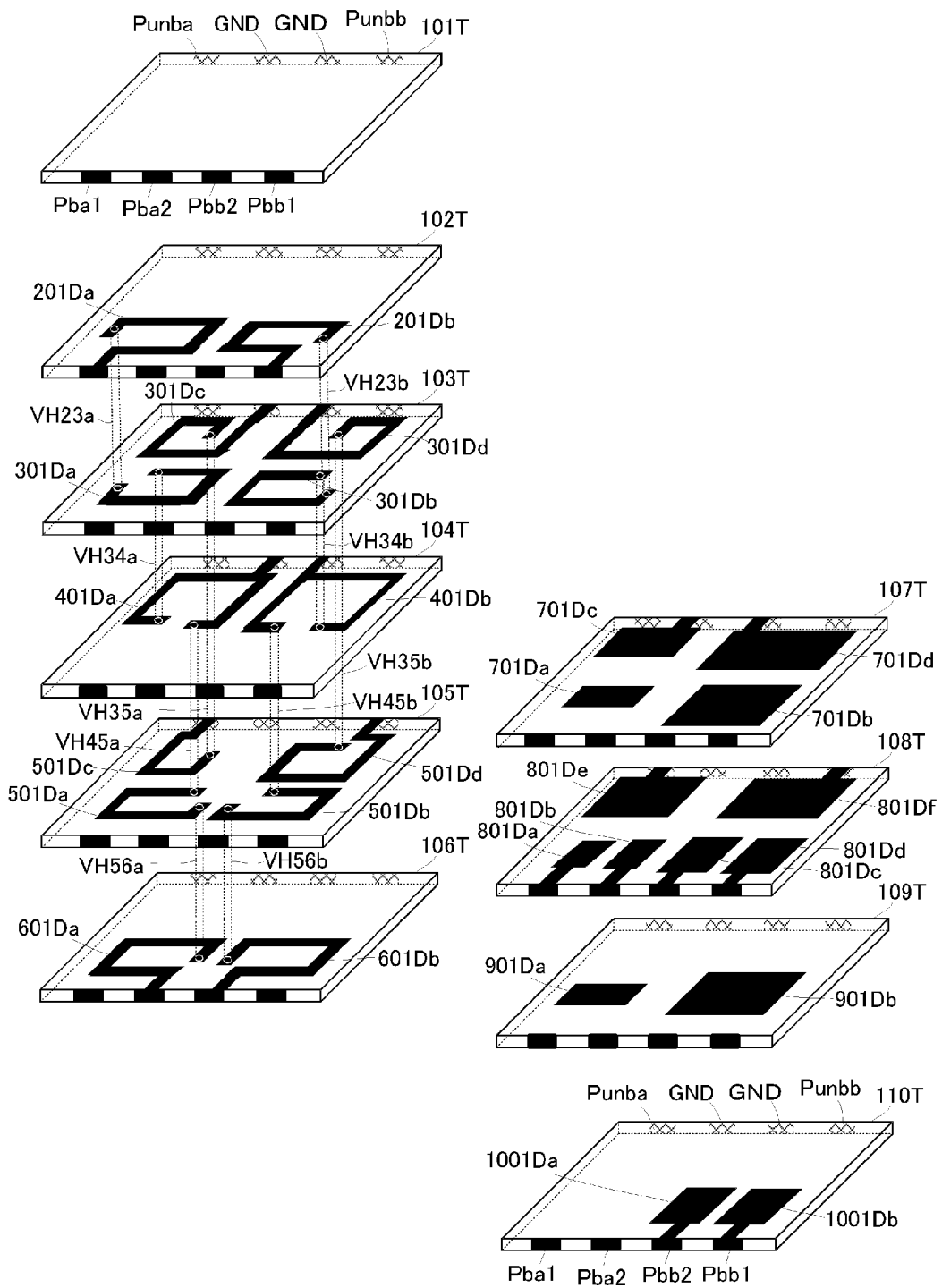
FIG. 13 is an exploded perspective view of the multilayer filter according to the fifth preferred embodiment of the present invention.

A structure of the multilayer filter 10D having the above-described circuit configuration will be described below. FIG. 12 is an external perspective view of the multilayer filter 10D according to the fifth preferred embodiment, and FIG. 13 is an exploded perspective view of the multilayer filter 10D according to the fifth preferred embodiment.

The circuit elements constituting the first filter circuit and the circuit elements constituting the second filter circuit are located in separate regions, when looking at the laminate 100D from above, so that the circuit elements of the first and second filter circuits are not coupled with each other in a high-frequency range. Further, winding directions of inductors are reversed between the first and second filter circuits, as seen from FIG. 13 in which the winding directions in a practical example are illustrated. Such a structure can prevent and minimize coupling between the first filter circuit and the second filter circuit.

The multilayer filter 10D is realized with a laminate 100D that preferably includes ten dielectric layers 101T to 110T, for example, stacked on each other.

As illustrated in FIG. 12, the laminate 100D preferably is substantially parallelepiped in its external shape. An outer electrode for the unbalanced terminal (hereinafter referred to as the "unbalanced terminal Punba") of the first filter circuit, ground electrodes (hereinafter referred to as "ground terminals GND"), and an outer electrode for the unbalanced terminal (hereinafter referred to as the "unbalanced terminal Punbb") of the second filter circuit are located on a first lateral surface of the laminate 100D and are arranged in the order named.

Outer electrodes for the first and second balanced terminals (hereinafter referred to respectively as the "first balanced terminal Pba1" and the "second balanced terminal Pba2") of the first filter circuit, and outer electrodes for the second and first balanced terminals (hereinafter referred to respectively as the "second balanced terminal Pbb2" and the "first balanced terminal Pbb1") of the second filter circuit are located on a second lateral surface of the laminate 100D, which is positioned opposite to the first lateral surface, and are arranged in the order named. In such a structure, the unbalanced terminal Punba and the first balanced terminal Pba1 of the first filter circuit are arranged opposite to each other. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100D. Though not illustrated, a marking electrode used to determine the mounting direction is preferably provided on an upper surface of the dielectric layer 101T, i.e., on a top surface of the laminate 100D.

Coil electrodes 201Da and 201Db are provided on the dielectric layer 102T. One end of the coil electrode 201Da is connected to the first balanced terminal Pba1 of the first filter circuit on the second lateral surface. The coil electrode 201Da preferably has a coiled shape, as viewed from above, starting from the one end thereof. The other end of the coil electrode 201Da is connected to one end of a coil electrode 301Da on the dielectric layer 103T through an electroconductive via electrode VH23a.

One end of the coil electrode 201Db is connected to the first balanced terminal Pbb1 of the second filter circuit on the second lateral surface. The coil electrode 201Db preferably has a coiled shape, as viewed from above, starting from the one end thereof. The other end of the coil electrode 201Db is connected to one end of a coil electrode 301Db on the dielectric layer 103T through an electroconductive via electrode VH23b.

Coil electrodes 301Da, 301Db, 301Dc and 301Dd are provided on the dielectric layer 103T.

The one end of the coil electrode 301Da is connected to the other end of the coil electrode 201Da through the via electrode VH23a. The coil electrode 301Da preferably has a coiled shape extending in the same winding direction as the coil electrode 201Da, as viewed from above, starting from the one end thereof. The other end of the coil electrode 301Da is connected to one end of a coil electrode 401Da on the dielectric layer 104T through an electroconductive via electrode VH34a. The coil electrode 301Da, the coil electrode 201Da, and the via electrode VH23a constitute the balanced-side inductor L3a of the first filter circuit.

The one end of the coil electrode 301Db is connected to the other end of the coil electrode 201Db through the via electrode VH23b. The coil electrode 301Db preferably has a coiled shape extending in the same winding direction as the coil electrode 201Db, as viewed from above, starting from the one end thereof. The other end of the coil electrode 301Db is connected to one end of a coil electrode 401Db on the dielectric layer 104T through an electroconductive via electrode VH34b. The coil electrode 301Db, the coil electrode 201Db, and the via electrode VH23b constitute the balanced-side inductor L3b of the second filter circuit.

One end of the coil electrode 301Dc is connected to the ground terminal GND of the first filter circuit on the first lateral surface. The coil electrode 301Dc preferably has a coiled shape, as viewed from above, starting from the one end thereof. The other end of the coil electrode 301Dc is connected to one end of a coil electrode 501Dc on the dielectric layer 105T through an electroconductive via electrode VH35a.

One end of the coil electrode 301Dd is connected to the ground terminal GND of the second filter circuit on the first lateral surface. The coil electrode 301Dd preferably has a coiled shape, as viewed from above, starting from the one end thereof. The other end of the coil electrode 301Dd is connected to one end of a coil electrode 501Dd on the dielectric layer 105T through an electroconductive via electrode VH35b.

The coil electrodes 401Da and 401Db are provided on the dielectric layer 104T. The one end of the coil electrode 401Da is connected to the other end of the coil electrode 301Da through the via electrode VH34a. The coil electrode 401Da preferably has a coiled shape such that at least a portion thereof overlaps with the coil electrode 301Dc, as viewed from above, for electromagnetic coupling with the coil electrode 301Dc. The other end of the coil electrode 401Da is connected to one end of a coil electrode 501Da on the dielectric layer 105T through a via electrode VH45a. The coil electrode 401Da constitutes the balanced-side inductor L2a of the first filter circuit.

The one end of the coil electrode 401Db is connected to the other end of the coil electrode 301Db through the via electrode VH34b. The coil electrode 401Db preferably has a coiled shape such that at least a portion thereof overlaps with the coil electrode 301Dd, as viewed from above, for electromagnetic coupling with the coil electrode 301Dd. The other end of the coil electrode 401Db is connected to one end of a coil electrode 501Db on the dielectric layer 105T through a via electrode VH45b. The coil electrode 401Db constitutes the balanced-side inductor L2b of the second filter circuit.

The coil electrodes 401Da and 401Db are each connected at a predetermined position along the coiled shape thereof to the ground terminal GND on the first lateral surface. The predetermined points of the balanced-side inductors L2a and L2b are thereby connected to the ground.

The coil electrodes 501Da, 501Db, 501Dc and 501Dd are provided on the dielectric layer 105T.

The one end of the coil electrode 501Da is connected to the other end of the coil electrode 401Da through the via electrode VH45a. The coil electrode 501Da preferably has a coiled shape, as viewed from above, starting from the one end thereof. The coil electrode 501Da is located in a region on the side closer to the first and second balanced terminals Pba1 and Pba2 of the first filter circuit, i.e., in a region overlapping with the coil electrodes 201Da and 301Da, when looking at the laminate 100D from above. The other end of the coil electrode 501Da is connected to one end of a coil electrode 601Da on the dielectric layer 106T through a via electrode VH56a.

The one end of the coil electrode 501Db is connected to the other end of the coil electrode 401Db through the via electrode VH45b. The coil electrode 501Db preferably has a coiled shape, as viewed from above, starting from the one end thereof. The coil electrode 501Db is located in a region on the side closer to the first and second balanced terminals Pbb1 and Pbb2 of the second filter circuit, i.e., in a region overlapping with the coil electrodes 201Db and 301Db, when looking at the laminate 100D from above. The other end of the coil electrode 501Db is connected to one end of a coil electrode 601Db on the dielectric layer 106T through a via electrode VH56b.

The one end of the coil electrode 501Dc is connected to the other end of the coil electrode 301Dc through the via electrode VH35a. The coil electrode 501Dc preferably has a coiled shape extending in the same winding direction as the coil electrode 301Dc, as viewed from above, starting from the one end thereof. Further, the coil electrode 501Dc is located at a position where at least a portion thereof overlaps with the coil electrode 401Da, when looking at the laminate from above, for electromagnetic coupling with the coil electrode 401Da. The other end of the coil electrode 501Dc is connected to the unbalanced terminal Punba of the first filter circuit. The coil electrode 501Dc, the coil electrode 301Dc, and the via electrode VH35a constitute the unbalanced-side inductor L1a of the first filter circuit.

The one end of the coil electrode 501Dd is connected to the other end of the coil electrode 301Dd through the via electrode VH35b. The coil electrode 501Dd preferably has a coiled shape extending in the same winding direction as the coil electrode 301Dd, as viewed from above, starting from the one end thereof. Further, the coil electrode 501Dd is located at a position where at least a portion thereof overlaps with the coil electrode 401Db, when looking at the laminate from above, for electromagnetic coupling with the coil electrode 401Db. The other end of the coil electrode 501Dd is connected to the unbalanced terminal Punbb of the second filter circuit. The coil electrode 501Dd, the coil electrode 301Dd, and the via electrode VH35b constitute the unbalanced-side inductor L1b of the second filter circuit.

The coil electrodes 601Da and 601Db are provided on the dielectric layer 106T. The one end of the coil electrode 601Da is connected to the other end of the coil electrode 501Da through the via electrode VH56a. The coil electrode 601Da preferably has a coiled shape extending in the same winding direction as the coil electrode 501Da, as viewed from above, starting from the one end thereof. The coil electrode 601Da, the coil electrode 501Da, and the via electrode VH56a constitute the balanced-side inductor L4a of the first filter circuit.

The one end of the coil electrode 601Db is connected to the other end of the coil electrode 501Db through the via electrode VH56b. The coil electrode 601Db preferably has a coiled shape extending in the same winding direction as the coil electrode 501Db, as viewed from above, starting from the one end thereof. The coil electrode 601Db, the coil electrode 501Db, and the via electrode VH56b constitute the balanced-side inductor L4b of the second filter circuit.

Plate electrodes 701Da, 701Db, 701Dc and 701Dd, each having a predetermined area and preferably having a substantially rectangular shape as viewed from above, are provided on the dielectric layer 107T.

The plate electrode 701Dc is located in a region on the side closer to the unbalanced terminal Punba of the first filter circuit, when looking at the laminate 100D from above. In other words, the plate electrode 701Dc is located in a region substantially matching with the regions where the coil electrodes 301Dc and 501Dc are located, when looking at the laminate 100D from above. The plate electrode 701Dc is connected to the ground terminal GND on the first lateral surface.

The plate electrode 701Dd is located in a region on the side closer to the unbalanced terminal Punbb of the second filter circuit, when looking at the laminate 100D from above. In other words, the plate electrode 701Dd is located in a region substantially matching with the regions where the coil electrodes 301Dd and 501Dd are located, when looking at the laminate 100D from above. The plate electrode 701Dd is connected to the ground terminal GND on the first lateral surface.

The plate electrode 701Da is located in a region on the side closer to the first and second balanced terminals Pba1 and Pba2 of the first filter circuit, when looking at the laminate 100D from above. The plate electrode 701Da is a floating electrode that is not connected to any outer terminals including the ground terminal GND.

The plate electrode 701Db is located in a region on the side closer to the first and second balanced terminals Pbb1 and Pbb2 of the second filter circuit, when looking at the laminate 100D from above. The plate electrode 701Db is a floating electrode that is not connected to any outer terminals including the ground terminal GND.

Plate electrodes 801Da, 801Db, 801Dc, 801Dd, 801De and 801Df, each having a predetermined area and preferably having a substantially rectangular shape as viewed from above, are provided on the dielectric layer 108T.

The plate electrode 801De is arranged in opposing relation to the plate electrode 701Dc in the stacking direction, i.e., when looking at the laminate 100D from above. The plate electrodes 801De and 701Dc and the dielectric layer 107T constitute the unbalanced-side capacitor C1a of the first filter circuit. The plate electrode 801De is connected to the unbalanced terminal Punba of the first filter circuit on the first lateral surface.

The plate electrode 801Df is arranged in opposing relation to the plate electrode 701Dd in the stacking direction, i.e., when looking at the laminate 100D from above. The plate electrodes 801Df and 701Dd and the dielectric layer 107T constitute the unbalanced-side capacitor C1b of the second filter circuit. The plate electrode 801Df is connected to the unbalanced terminal Punbb of the second filter circuit on the first lateral surface.

The plate electrodes 801Da and 801Db are each arranged in opposing relation to the plate electrode 701Da in the stacking direction. The plate electrode 801Da is connected to the first balanced terminal Pba1 of the first filter circuit on the second lateral surface, and the plate electrode 801Db is connected to the second balanced terminal Pba2 of the first filter circuit on the second lateral surface.

The plate electrodes 801Dc and 801Dd are each arranged in opposing relation to the plate electrode 701Db in the stacking direction. The plate electrode 801Dc is connected to the second balanced terminal Pbb2 of the second filter circuit on the second lateral surface, and the plate electrode 801Dd is connected to the first balanced terminal Pbb1 of the second filter circuit on the second lateral surface.

Plate electrodes 901Da and 901Db, each having a predetermined area and preferably having a substantially rectangular shape as viewed from above, are provided on the dielectric layer 109T. The plate electrode 901Da is arranged in opposing relation to the plate electrodes 801Da and 801Db in the stacking direction. The plate electrodes 901Da, 801Da and 701Da and the dielectric layers 107T and 108T constitute the first balanced-side capacitor C2a of the first filter circuit. The plate electrodes 901Da, 801Db and 701Da and the dielectric layers 107T and 108T constitute the second balanced-side capacitor C3a of the first filter circuit.

The plate electrode 901Db is arranged in opposing relation to the plate electrodes 801Dc and 801Dd in the stacking direction.

Plate electrodes 1001Da and 1001Db, each having a predetermined area and preferably having a substantially rectangular shape as viewed from above, are provided on the dielectric layer 110T. The plate electrodes 1001Da and 1001Db are each arranged in opposing relation to the plate electrode 901Db in the stacking direction.

The plate electrodes 701Db, 801Dc, 901Db and 1001Da and the dielectric layers 107T, 108T and 109T constitute the second balanced-side capacitor C3b of the second filter circuit. The plate electrodes 701Db, 801Dd, 901Db and 1001Db and the dielectric layers 107T, 108T and 109T constitute the first balanced-side capacitor C2b of the second filter circuit.

The plate electrode 1001Da is connected to the second balanced terminal Pbb2 of the second filter circuit. The plate electrode 1001Db is connected to the first balanced terminal Pbb1 of the second filter circuit.

With the above-described arrangement of this fifth preferred embodiment, even when a plurality of filter circuits are located in one laminate, the multilayer filter having the stable balance characteristic can also be realized as in the above-described preferred embodiments.

A multilayer filter according to a sixth preferred embodiment will be described below with reference to the drawings. A multilayer filter 10E of this sixth preferred embodiment is provided by modifying the multilayer filter 10D of the fifth preferred embodiment such that, instead of connecting the predetermined point in each of the balanced-side inductors L2a and L2b to the ground, a DC feed terminal Pdc is connected to a predetermined point in each of the balanced-side inductors L2a and L2b.

Figure 14:
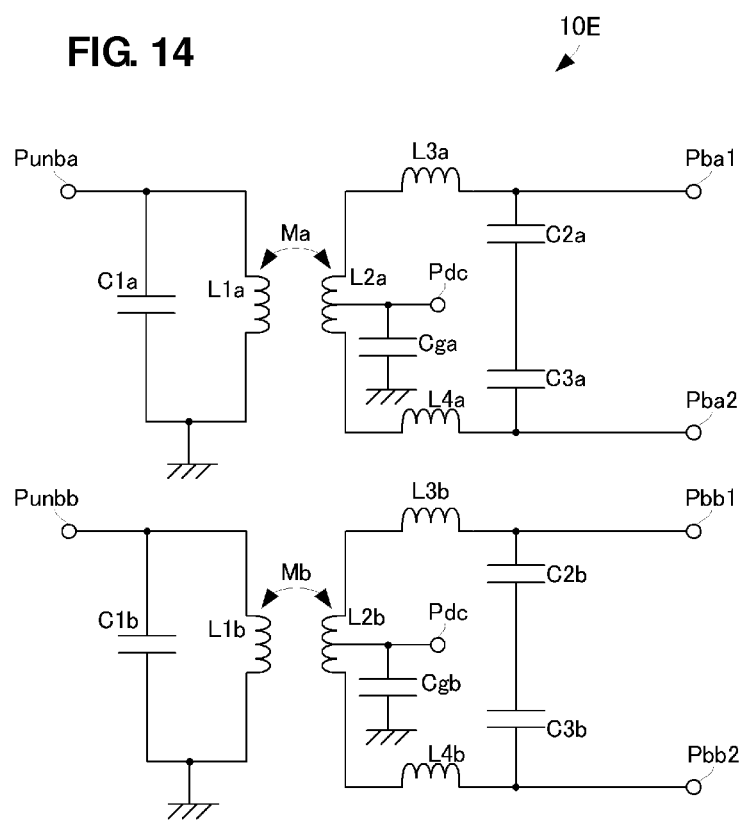
FIG. 14 is a circuit diagram of a multilayer filter according to a sixth preferred embodiment of the present invention.

FIG. 14 is a circuit diagram of the multilayer filter 10E according to the sixth preferred embodiment. As illustrated in FIG. 14, a predetermined point of the balanced-side inductor L2a of the first filter circuit is connected to the DC feed terminal Pdc. A line connecting the DC feed terminal Pdc and the balanced-side inductor L2a is connected to the ground through a capacitor Cga. The other arrangement is similar to that of the first filter circuit in the multilayer filter 10D of the fifth preferred embodiment, and hence the detailed description of the circuit configuration is omitted here.

Also, as illustrated in FIG. 14, a predetermined point of the balanced-side inductor L2b of the second filter circuit is connected to the DC feed terminal Pdc. A line connecting the DC feed terminal Pdc and the balanced-side inductor L2b is connected to the ground through a capacitor Cgb. The other arrangement is similar to that of the second filter circuit in the multilayer filter 10D of the fifth preferred embodiment, and hence the detailed description of the circuit configuration is omitted here.

Figure 15:
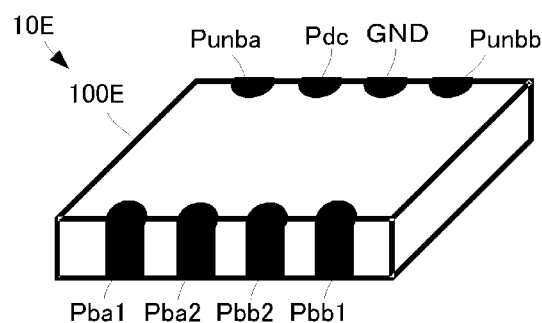
FIG. 15 is an external perspective view of the multilayer filter according to the sixth preferred embodiment of the present invention.
Figure 16:
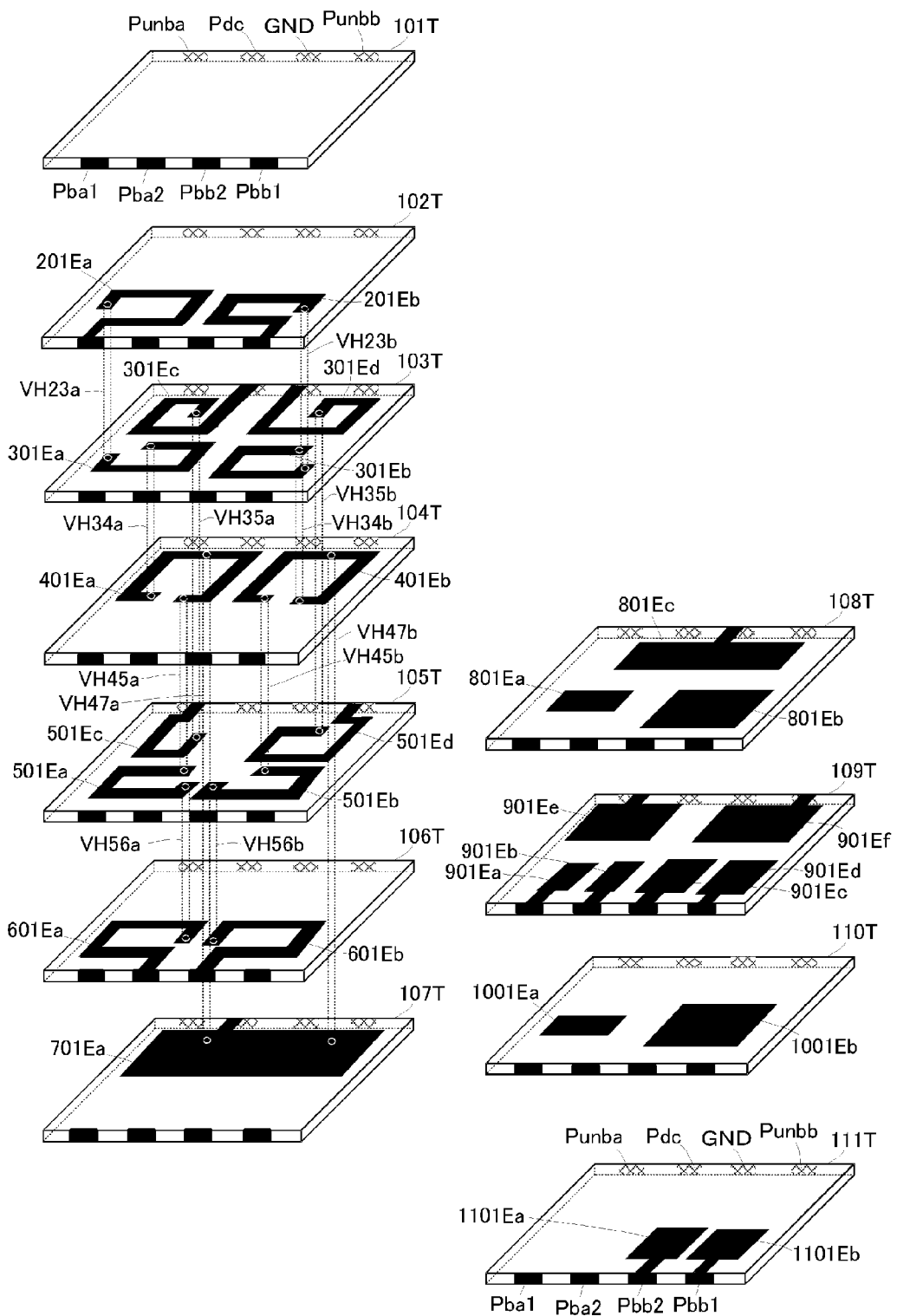
FIG. 16 is an exploded perspective view of the multilayer filter according to the sixth preferred embodiment of the present invention.

FIG. 15 is an external perspective view of the multilayer filter 10E according to the sixth preferred embodiment, and FIG. 16 is an exploded perspective view of the multilayer filter 10E according to the sixth preferred embodiment.

The multilayer filter 10E is realized with a laminate 100E that preferably includes eleven dielectric layers 101T to 111T, for example.

As illustrated in FIG. 15, the laminate 100E preferably is substantially parallelepiped in its external shape. An outer electrode for the unbalanced terminal (hereinafter referred to as the "unbalanced terminal Punba") of the first filter circuit, an electrode for the DC feed terminal (hereinafter referred to as the "DC feed terminal Pdc"), a ground electrode (hereinafter referred to as the "ground terminal GND"), and an outer electrode for an unbalanced terminal (hereinafter referred to as the "unbalanced terminal Punbb") of the second filter circuit are located on a first lateral surface of the laminate 100E and are arranged in the order named.

Outer electrodes for the first and second balanced terminals (hereinafter referred to respectively as the "first balanced terminal Pba1" and the "second balanced terminal Pba2") of the first filter circuit, and outer electrodes for the second and first balanced terminals (hereinafter referred to respectively as the "second balanced terminal Pbb2" and the "first balanced terminal Pbb1") of the second filter circuit are located on a second lateral surface of the laminate 100E, which is positioned opposite to the first lateral surface, and are arranged in the order named. In such a structure, the unbalanced terminal Punba and the first balanced terminal Pba1 of the first filter circuit are arranged opposite to each other. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100E. Though not illustrated, a marking electrode used to determine the mounting direction is preferably provided on an upper surface of the dielectric layer 101T, i.e., on a top surface of the laminate 100E.

Coil electrodes 201Ea and 201Eb are provided on the dielectric layer 102T. One end of the coil electrode 201Ea is connected to the first balanced terminal Pba1 of the first filter circuit on the second lateral surface. The coil electrode 201Ea preferably has a coiled shape, as viewed from above, starting from the one end thereof. The other end of the coil electrode 201Ea is connected to one end of a coil electrode 301Ea on the dielectric layer 103T through an electroconductive via electrode VH23a.

One end of the coil electrode 201Eb is connected to the first balanced terminal Pbb1 of the second filter circuit on the second lateral surface. The coil electrode 201Eb preferably has a coiled shape, as viewed from above, starting from the one end thereof. The other end of the coil electrode 201Eb is connected to one end of a coil electrode 301Eb on the dielectric layer 103T through an electroconductive via electrode VH23b.

Coil electrodes 301Ea, 301Eb, 301Ec and 301Ed are provided on the dielectric layer 103T.

The one end of the coil electrode 301Ea is connected to the other end of the coil electrode 201Ea through the via electrode VH23a. The coil electrode 301Ea preferably has a coiled shape extending in the same winding direction as the coil electrode 201Ea, as viewed from above, starting from the one end thereof. The other end of the coil electrode 301Ea is connected to one end of a coil electrode 401Ea on the dielectric layer 104T through an electroconductive via electrode VH34a. The coil electrode 301Ea, the coil electrode 201Ea, and the via electrode VH23a constitute the balanced-side inductor L3a of the first filter circuit.

The one end of the coil electrode 301Eb is connected to the other end of the coil electrode 201Eb through the via electrode VH23b. The coil electrode 301Eb preferably has a coiled shape extending in the same winding direction as the coil electrode 201Eb, as viewed from above, starting from the one end thereof. The other end of the coil electrode 301Eb is connected to one end of a coil electrode 401Eb on the dielectric layer 104T through an electroconductive via electrode VH34b. The coil electrode 301Eb, the coil electrode 201Eb, and the via electrode VH23b constitute the balanced-side inductor L3b of the second filter circuit.

One end of the coil electrode 301Ec is connected to the unbalanced terminal Punba of the first filter circuit on the first lateral surface. The coil electrode 301Ec preferably has a coiled shape, as viewed from above, starting from the one end thereof. The other end of the coil electrode 301Ec is connected to one end of a coil electrode 501Ec on the dielectric layer 105T through an electroconductive via electrode VH35a.

One end of the coil electrode 301Ed is connected to the unbalanced terminal Punbb of the second filter circuit on the first lateral surface. The coil electrode 301Ed preferably has a coiled shape, as viewed from above, starting from the one end thereof. The other end of the coil electrode 301Ed is connected to one end of a coil electrode 501Ed on the dielectric layer 105T through an electroconductive via electrode VH35b.

The coil electrode 401Ea and 401Eb are provided on the dielectric layer 104T. The one end of the coil electrode 401Ea is connected to the other end of the coil electrode 301Ea through the via electrode VH34a. The coil electrode 401Ea preferably has a coiled shape such that at least a portion thereof overlaps with the coil electrode 301Ec, as viewed from above, for electromagnetic coupling with the coil electrode 301Ec. The other end of the coil electrode 401Ea is connected to one end of a coil electrode 501Ea on the dielectric layer 105T through a via electrode VH45a. The coil electrode 401Ea constitutes the balanced-side inductor L2a of the first filter circuit.

The one end of the coil electrode 401Eb is connected to the other end of the coil electrode 301Eb through the via electrode VH34b. The coil electrode 401Eb preferably has a coiled shape such that at least a part thereof overlaps with the coil electrode 301Ed, as viewed from above, for electromagnetic coupling with the coil electrode 301Ed. The other end of the coil electrode 401Eb is connected to one end of a coil electrode 501Eb on the dielectric layer 105T through a via electrode VH45b. The coil electrode 401Eb constitutes the balanced-side inductor L2b of the second filter circuit.

Further, the coil electrode 401Ea is connected at a predetermined position along the coiled shape thereof to a plate electrode 701Ea on the dielectric layer 107T through a via electrode VH47a. The coil electrode 401Eb is connected at a predetermined position along the coiled shape thereof to the plate electrode 701Ea on the dielectric layer 107T through a via electrode VH47b.

The coil electrodes 501Ea, 501Eb, 501Ec and 501Ed are provided on the dielectric layer 105T.

The one end of the coil electrode 501Ea is connected to the other end of the coil electrode 401Ea through the via electrode VH45a. The coil electrode 501Ea preferably has a coiled shape, as viewed from above, starting from the one end thereof. The coil electrode 501Ea is located in a region on the side closer to the first and second balanced terminals Pba1 and Pba2 of the first filter circuit, i.e., in a region overlapping with the coil electrode 201Ea and 301Ea, when looking at the laminate 100E from above. The other end of the coil electrode 501Ea is connected to one end of a coil electrode 601Ea on the dielectric layer 106T through a via electrode VH56a.

The one end of the coil electrode 501Eb is connected to the other end of the coil electrode 401Eb through the via electrode VH45b. The coil electrode 501Eb preferably has a coiled shape, as viewed from above, starting from the one end thereof. The coil electrode 501Eb is located in a region on the side closer to the first and second balanced terminals Pbb1 and Pbb2 of the second filter circuit, i.e., in a region overlapping with the coil electrode 201Eb and 301Eb, when looking at the laminate 100E from above. The other end of the coil electrode 501Eb is connected to one end of a coil electrode 601Eb on the dielectric layer 106T through a via electrode VH56b.

The one end of the coil electrode 501Ec is connected to the other end of the coil electrode 301Ec through the via electrode VH35a. The coil electrode 501Ec preferably has a coiled shape extending in the same winding direction as the coil electrode 301Ec, as viewed from above, starting from the one end thereof. The coil electrode 501Ec is located at a position where at least a portion thereof overlaps with the coil electrode 401Ea, when looking at the laminate from above, for electromagnetic coupling with the coil electrode 401Ea. The other end of the coil electrode 501Ec is connected to the unbalanced terminal Punba of the first filter circuit. The coil electrode 501Ec, the coil electrode 301Ec, and the via electrode VH35a constitute the unbalanced-side inductor L1a of the first filter circuit.

The one end of the coil electrode 501Ed is connected to the other end of the coil electrode 301Ed through the via electrode VH35b. The coil electrode 501Ed preferably has a coiled shape extending in the same winding direction as the coil electrode 301Ed, as viewed from above, starting from the one end thereof. The coil electrode 501Ed is located at a position where at least a portion thereof overlaps with the coil electrode 401Eb, when looking at the laminate from above, for electromagnetic coupling with the coil electrode 401Eb. The other end of the coil electrode 501Ed is connected to the unbalanced terminal Punbb of the second filter circuit. The coil electrode 501Ed, the coil electrode 301Ed, and the via electrode VH35b constitute the unbalanced-side inductor Lib of the second filter circuit.

The coil electrodes 601Ea and 601Eb are provided on the dielectric layer 106T. The one end of the coil electrode 601Ea is connected to the other end of the coil electrode 501Ea through the via electrode VH56a. The coil electrode 601Ea preferably has a coiled shape extending in the same winding direction as the coil electrode 501Ea, as viewed from above, starting from the one end thereof. The coil electrode 601Ea, the coil electrode 501Ea, and the via electrode VH56a constitute the balanced-side inductor L4a of the first filter circuit.

The one end of the coil electrode 601Eb is connected to the other end of the coil electrode 501Eb through the via electrode VH56b. The coil electrode 601Eb preferably has a coiled shape extending in the same winding direction as the coil electrode 501Eb, as viewed from above, starting from the one end thereof. The coil electrode 601Eb, the coil electrode 501Eb, and the via electrode VH56b constitute the balanced-side inductor L4b of the second filter circuit.

The plate electrode 701Ea having a substantially rectangular shape, as viewed from above, is provided on the dielectric layer 107T. The plate electrode 701Ea is located in a region substantially matching with the regions where the coil electrodes 401Ea and 401Eb on the dielectric layer 104T are located, when looking at the laminate 100E from above. The plate electrode 701Ea is connected to the DC feed terminal Pdc on the first lateral surface.

Plate electrodes 801Ea, 801Eb and 801Ec, each having a substantially rectangular shape as viewed from above, are provided on the dielectric layer 108T. The plate electrode 801Ec is arranged in opposing relation to the plate electrode 701Ea in the stacking direction. The plate electrode 801Ec is connected to the ground terminal GND on the first lateral surface. The plate electrodes 801Ec and 701Ea and the dielectric layer 107T constitute the DC feed capacitors Cga and Cgb.

DC feed circuits for the balanced-side inductors L2a and L2b, which constitute different filter circuits in the multilayer filter 10E, are arranged in a partially shared manner with the above-described structures of the dielectric layers 107T and 108T and the above-described connection arrangements of the via electrodes VH47a and VH47b to the coil electrodes 401Ea and 401Eb on the dielectric layer 104T. As a result, the size of the multilayer filter 10E can be reduced.

The plate electrode 801Ea is located in a region on the side closer to the first and second balanced terminals Pba1 and Pba2 of the first filter circuit, when looking at the laminate 100E from above. The plate electrode 801Ea is a floating electrode that is not connected to any outer terminals including the ground terminal GND.

The plate electrode 801Eb is located in a region on the side closer to the first and second balanced terminals Pbb1 and Pbb2 of the second filter circuit, when looking at the laminate 100E from above. The plate electrode 801Eb is a floating electrode that is not connected to any outer terminals including the ground terminal GND.

Plate electrodes 901Ea, 901Eb, 901Ec, 901Ed, 901Ee and 901Ef, each having a predetermined area and having a substantially rectangular shape as viewed from above, are provided on the dielectric layer 109T.

The plate electrode 901Ee is arranged in opposing relation to the plate electrode 801Ec, when looking at the laminate 100E from above. The plate electrodes 901Ee and 801Ec and the dielectric layer 108T constitute the unbalanced-side capacitor C1a of the first filter circuit. The plate electrode 901Ee is connected to the unbalanced terminal Punba on the first lateral surface.

The plate electrode 901Ef is arranged in opposing relation to the plate electrode 801Ec, when looking at the laminate 100E from above. The plate electrodes 901Ef and 801Ec and the dielectric layer 108T constitute the unbalanced-side capacitor C1b of the second filter circuit. The plate electrode 901Ef is connected to the unbalanced terminal Punbb on the first lateral surface.

The plate electrodes 901Ea and 901Eb are each arranged in opposing relation to the plate electrode 801Ea in the stacking direction. The plate electrodes 901Ec and 901Ed are each arranged in opposing relation to the plate electrode 801Eb in the stacking direction.

Plate electrodes 1001Ea and 1001Eb, each having a substantially rectangular shape as viewed from above, are provided on the dielectric layer 110T. The plate electrode 1001Ea is arranged in opposing relation to the plate electrodes 801Ea and 901Ea, when looking at the laminate 100E from above. The plate electrodes 1001Ea, 901Ea and 801Ea and the dielectric layers 108T and 109T constitute the first balanced-side capacitor C2a of the first filter circuit. Also, the plate electrode 1001Ea is arranged in opposing relation to the plate electrodes 801Ea and 901Eb, when looking at the laminate 100E from above. The plate electrodes 1001Ea, 901Eb and 801Ea and the dielectric layers 108T and 109T constitute the second balanced-side capacitor C3a of the first filter circuit.

The plate electrode 1001Eb is arranged in opposing relation to the plate electrodes 901Ec and 901Ed, when looking at the laminate 100E from above.

Plate electrodes 1101Ea and 1101Eb, each having a substantially rectangular shape as viewed from above, are provided on the dielectric layer 111T. The plate electrode 1101Ea is arranged in opposing relation to the plate electrodes 801Eb, 901Ec and 1001Eb, when looking at the laminate 100E from above. The plate electrodes 1101Ea, 1001Eb, 901Ec and 801Eb and the dielectric layers 108T, 109T and 110T constitute the second balanced-side capacitor C3b of the second filter circuit.

The plate electrode 1101Eb is arranged in opposing relation to the plate electrodes 801Eb, 901Ed and 1001Eb, when looking at the laminate 100E from above. The plate electrodes 1101Eb, 1001Eb, 901Ed and 801Eb and the dielectric layers 108T, 109T and 110T constitute the first balanced-side capacitor C2b of the second filter circuit.

With the above-described arrangement of this sixth preferred embodiment, the multilayer filter having the stable balance characteristic can also be realized as in the above-described preferred embodiments.

A multilayer filter according to a seventh preferred embodiment will be described below with reference to the drawings.

Figure 17:
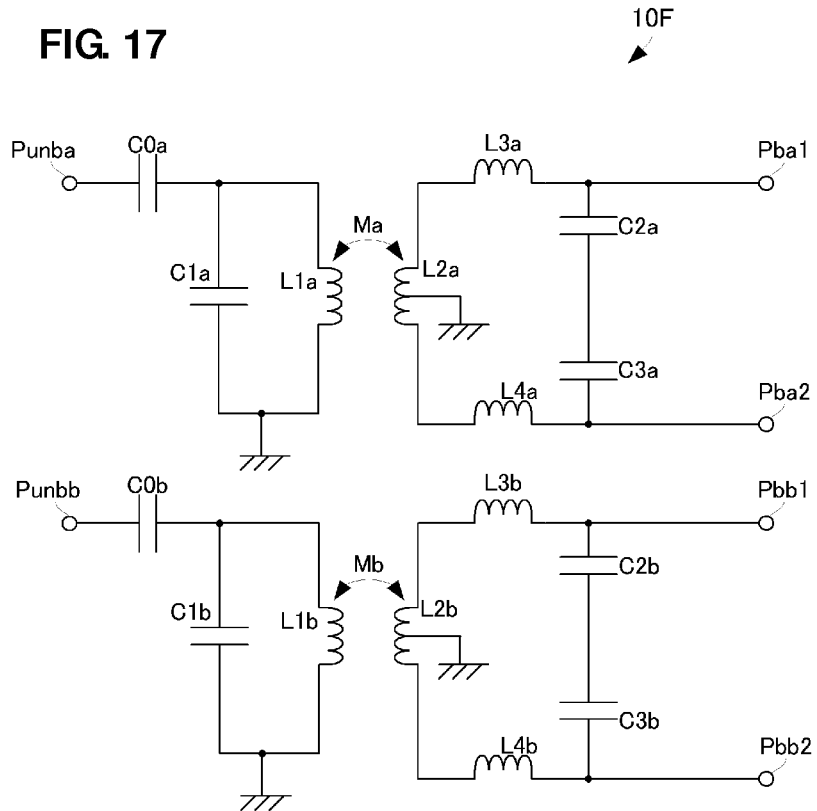
FIG. 17 is a circuit diagram of a multilayer filter according to a seventh preferred embodiment of the present invention.

FIG. 17 is a circuit diagram of a multilayer filter 10F according to the seventh preferred embodiment. As illustrated in FIG. 17, the multilayer filter 10F of this seventh preferred embodiment is provided preferably by modifying the circuit configuration of the multilayer filter 10D of the fifth preferred embodiment such that a capacitor C0a is connected in series between the unbalanced terminal Punba and the resonance circuit including the unbalanced-side inductor L1a and the unbalanced-side capacitor C1a in the first filter circuit, and that a capacitor C0b is connected in series between the unbalanced terminal Punbb and the resonance circuit including the unbalanced-side inductor L1b and the unbalanced-side capacitor C1b in the second filter circuit. The description of the other circuit configuration is omitted here.

Figure 18:
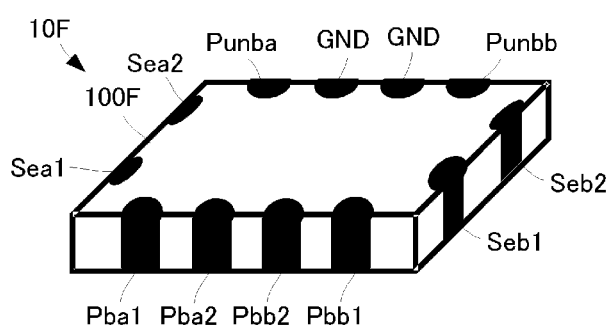
FIG. 18 is an external perspective view of the multilayer filter according to the seventh preferred embodiment of the present invention.
Figure 19:
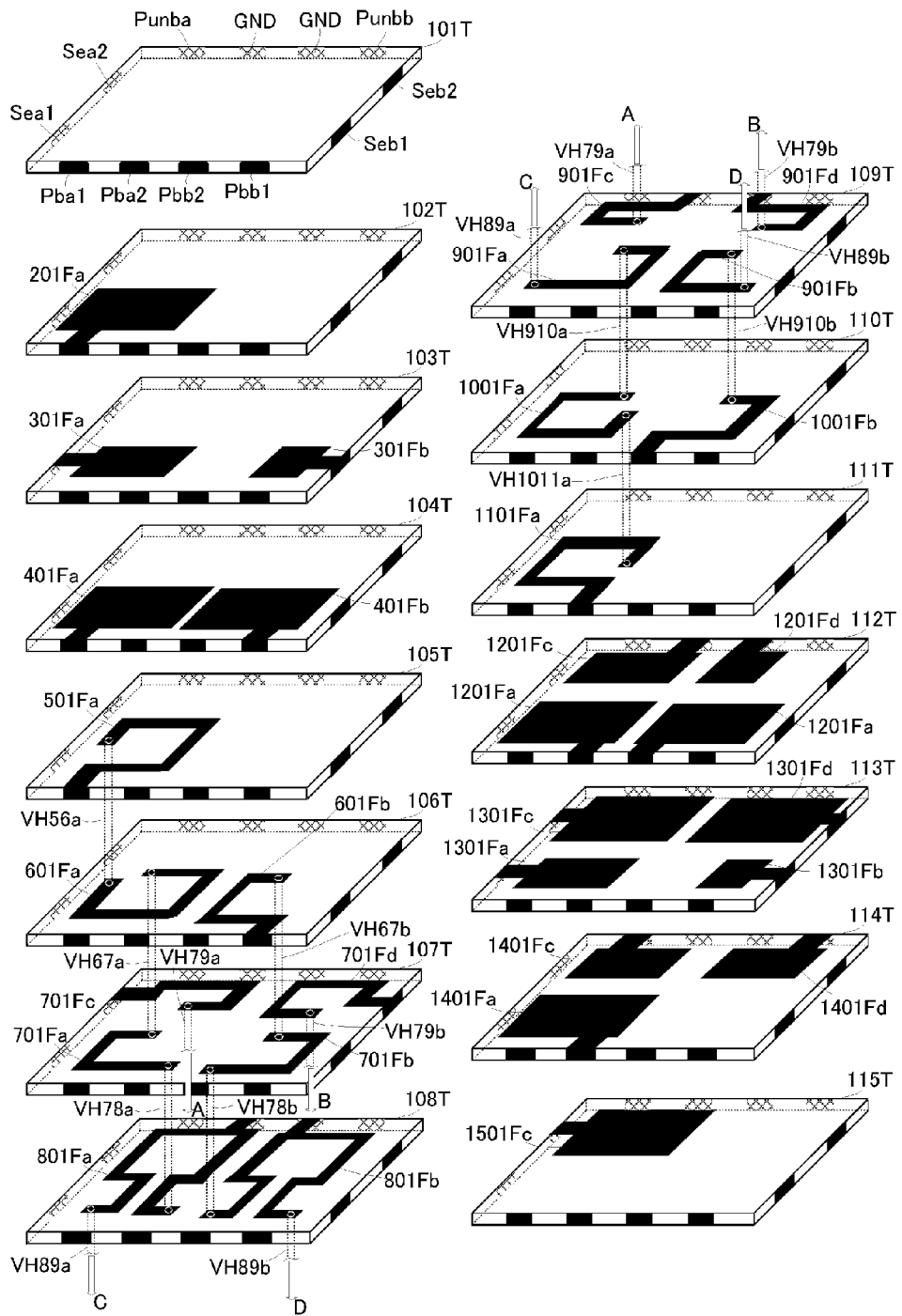
FIG. 19 is an exploded perspective view of the multilayer filter according to the seventh preferred embodiment of the present invention.

FIG. 18 is an external perspective view of the multilayer filter 10F according to the seventh preferred embodiment, and FIG. 19 is an exploded perspective view of the multilayer filter 10F according to the seventh preferred embodiment.

The multilayer filter 10F is realized with a laminate 100F that preferably includes fifteen dielectric layers 101T to 115T, for example, stacked on each other.

As illustrated in FIG. 18, the laminate 100F preferably is substantially parallelepiped in its external shape. An outer electrode for the unbalanced terminal (hereinafter referred to as the "unbalanced terminal Punba") of the first filter circuit, ground electrodes (hereinafter referred to as "ground terminals GND"), and an outer electrode for the unbalanced terminal (hereinafter referred to as the "unbalanced terminal Punbb") of the second filter circuit are located on a first lateral surface of the laminate 100F and are arranged in the order named.

Outer electrodes for the first and second balanced terminals (hereinafter referred to respectively as the "first balanced terminal Pba1" and the "second balanced terminal Pba2") of the first filter circuit, and outer electrodes for the second and first balanced terminals (hereinafter referred to respectively as the "second balanced terminal Pbb2" and the "first balanced terminal Pbb1") of the second filter circuit are located on a second lateral surface of the laminate 100F, which is positioned opposite to the first lateral surface, and are arranged in the order named. In such a structure, the unbalanced terminal Punba and the first balanced terminal Pba1 of the first filter circuit are arranged opposite to each other.

Connection electrodes Sea1 and Sea2 are located and arranged on a third lateral surface, which is perpendicular to the first and second lateral surfaces and which is positioned on the same side as the first filter circuit. Connection electrodes Seb1 and Seb2 are located and arranged on a fourth lateral surface, which is perpendicular to the first and second lateral surfaces and which is positioned on the same side as the second filter circuit. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100F. Though not illustrated, a marking electrode used to determine the mounting direction is preferably provided on an upper surface of the dielectric layer 101T, i.e., on a top surface of the laminate 100F.

A plate electrode 201Fa having a substantially rectangular shape, as viewed from above, is provided on the dielectric layer 102T. The plate electrode 201Fa is located in a region on the side closer to the first and second balanced terminals Pba1 and Pba2 of the first filter circuit, when looking at the laminate 100F from above. The plate electrode 201Fa is connected to the first balanced terminal Pba1 of the first filter circuit on the second lateral surface.

Plate electrodes 301Fa and 301Fb, each having a substantially rectangular shape as viewed from above, are provided on the dielectric layer 103T. The plate electrode 301Fa is arranged in opposing relation to the plate electrode 201Fa in the stacking direction. The plate electrode 301Fa is connected to the connection electrode Sea1 on the third lateral surface.

The plate electrode 301Fb is located in a region on the side closer to the first and second balanced terminals Pbb1 and Pbb2 of the second filter circuit, when looking at the laminate 100F from above. The plate electrode 301Fb is connected to the connection electrode Seb1 on the fourth lateral surface.

Plate electrodes 401Fa and 401Fb, each having a substantially rectangular shape as viewed from above, are provided on the dielectric layer 104T. The plate electrode 401Fa is arranged in opposing relation to the plate electrode 301Fa in the stacking direction. The plate electrode 401Fa is connected to the first balanced terminal Pba1 of the first filter circuit on the second lateral surface.

The plate electrodes 401Fa, 301Fa and 201Fa and the dielectric layers 102T and 103T constitute the first balanced-side capacitor C2a of the first filter circuit.

The plate electrode 401Fb is arranged in opposing relation to the plate electrode 301Fb in the stacking direction. The plate electrode 401Fb is connected to the first balanced terminal Pbb1 of the second filter circuit on the second lateral surface.

The plate electrodes 401Fb and 301Fb and the dielectric layers 103T constitute the second balanced-side capacitor C2b of the first filter circuit.

On the dielectric layer 105T, a coil electrode 501Fa is located in a region on the side where the first filter circuit is located. One end of the coil electrode 501Fa is connected to the first balanced terminal Pba1 of the first filter circuit on the second lateral surface. The coil electrode 501Fa preferably has a coiled shape extending in the predetermined winding direction, as viewed from above, starting from the one end thereof. The other end of the coil electrode 501Fa is connected to one end of a coil electrode 601Fa on the dielectric layer 106T through a via electrode VH56a.

On the dielectric layer 106T, the coil electrode 601Fa is located in a region on the side where the first filter circuit is located, and a coil electrode 601Fb is located in a region on the side where the second filter circuit is located.

The one end of the coil electrode 601Fa is connected to the other end of the coil electrode 501Fa through the via electrode VH56a. The coil electrode 601Fa preferably has a coiled shape extending in the same winding direction as the coil electrode 501Fa, starting from the one end thereof. The other end of the coil electrode 601Fa is connected to one end of a coil electrode 701Fa on the dielectric layer 107T through a via electrode VH67a.

One end of the coil electrode 601Fb is connected to the first balanced terminal Pbb1 of the second filter circuit on the second lateral surface. The coil electrode 601Fb preferably has a coiled shape extending in the winding direction reversed to that of the coil electrode 601Fa, starting from the one end thereof. The other end of the coil electrode 601Fb is connected to one end of a coil electrode 701Fb on the dielectric layer 107T through a via electrode VH67b.

On the dielectric layer 107T, coil electrodes 701Fa and 701Fc are located in a region on the side where the first filter circuit is located, and coil electrodes 701Fb and 701Fd are located in a region on the side where the second filter circuit is located.

The one end of the coil electrode 701Fa is connected to the other end of the coil electrode 601Fa through the via electrode VH67a. The coil electrode 701Fa preferably has a coiled shape extending in the same winding direction as the coil electrode 601Fa, starting from the one end thereof. The coil electrodes 701Fa, 601Fa and 501Fa and the via electrodes VH56a and VH67a constitute the balanced-side inductor L3a of the first filter circuit. The other end of the coil electrode 701Fa is connected to one end of a coil electrode 801Fa on the dielectric layer 108T through a via electrode VH78a.

The one end of the coil electrode 701Fb is connected to the other end of the coil electrode 601Fb through the via electrode VH67b. The coil electrode 701Fb preferably has a coiled shape extending in the same winding direction as the coil electrode 601Fb, starting from the one end thereof. The coil electrodes 701Fb and 601Fb and the via electrode VH67b constitute the balanced-side inductor L3b of the second filter circuit. The other end of the coil electrode 701Fb is connected to one end of a coil electrode 801Fb on the dielectric layer 108T through a via electrode VH78b.

The coil electrode 701Fc is located on the side closer to the first lateral surface than the coil electrode 701Fa, i.e., on the side closer to the unbalanced terminal Punba of the first filter circuit, as viewed from above. One end of the coil electrode 701Fc is connected to the connection electrode Sea2 on the third lateral surface. The coil electrode 701Fc preferably has a coiled shape, starting from the one end thereof. The other end of the coil electrode 701Fc is connected to one end of a coil electrode 901Fc on the dielectric layer 109T through a via electrode VH79a.

The coil electrode 701Fd is located on the side closer to the first lateral surface than the coil electrode 701Fb, i.e., on the side closer to the unbalanced terminal Punbb of the second filter circuit, as viewed from above. One end of the coil electrode 701Fd is connected to the connection electrode Seb2 on the fourth lateral surface. The coil electrode 701Fd preferably has a coiled shape in the winding direction reversed to that of the coil electrode 701Fc, starting from the one end thereof. The other end of the coil electrode 701Fd is connected to one end of a coil electrode 901Fd on the dielectric layer 109T through a via electrode VH79b.

On the dielectric layer 108T, the coil electrode 801Fa is located in a region on the side where the first filter circuit is located, and the coil electrode 801Fb is located in a region on the side where the second filter circuit is located.

The one end of the coil electrode 801Fa is connected to the other end of the coil electrode 701Fa through the via electrode VH78a. The coil electrode 801Fa preferably has a coiled shape, starting from the one end thereof. In addition, the coil electrode 801Fa preferably has such a shape that at least a portion thereof overlaps with the coil electrode 701Fc, as viewed from above, for electromagnetic coupling with the coil electrode 701Fc. The other end of the coil electrode 801Fa is connected to one end of a coil electrode 901Fa on the dielectric layer 109T through a via electrode VH89a. The coil electrode 801Fa constitutes the balanced-side inductor L2a of the first filter circuit.

The one end of the coil electrode 801Fb is connected to the other end of the coil electrode 701Fb through the via electrode VH78b. The coil electrode 801Fb preferably has a coiled shape, starting from the one end thereof. In addition, the coil electrode 801Fb preferably has such a shape that at least a portion thereof overlaps with the coil electrode 701Fd, as viewed from above, for electromagnetic coupling with the coil electrode 701Fd. The other end of the coil electrode 801Fb is connected to one end of a coil electrode 901Fb on the dielectric layer 109T through a via electrode VH89b. The coil electrode 801Fb constitutes the balanced-side inductor L2b of the second filter circuit.

On the dielectric layer 109T, the coil electrodes 901Fa and 901Fc are located in a region on the side where the first filter circuit is located, and the coil electrodes 901Fb and 901Fd are located in a region on the side where the second filter circuit is located.

The one end of the coil electrode 901Fc is connected to the other end of the coil electrode 701Fc through the via electrode VH79a. The coil electrode 901Fc preferably has a coiled shape extending in the same winding direction as the coil electrode 701Fc, starting from the one end thereof. The coil electrode 901Fa and the coil electrode 701Fc are located such that their regions are substantially matched with each other as viewed from above. The coil electrodes 901Fc and 701Fc and the via electrode VH79a constitute the unbalanced-side inductor L1a of the first filter circuit. The other end of the coil electrode 901Fc is connected to the ground terminal GND on the first lateral surface.

The one end of the coil electrode 901Fd is connected to the other end of the coil electrode 701Fd through the via electrode VH79b. The coil electrode 901Fd preferably has a coiled shape extending in the same winding direction as the coil electrode 701Fd, starting from the one end thereof. The coil electrode 901Fd and the coil electrode 701Fd are located such that their regions are substantially matched with each other as viewed from above. The coil electrodes 901Fd and 701Fd and the via electrode VH79b constitute the unbalanced-side inductor L1b of the second filter circuit. The other end of the coil electrode 901Fd is connected to the ground terminal GND on the first lateral surface.

The one end of the coil electrode 901Fa is connected to the other end of the coil electrode 801Fa through the via electrode VH89a. The coil electrode 901Fa is located in a region on the side closer to the second lateral surface than the coil electrode 901Fc and preferably has a coiled shape extending in the same winding direction as the coil electrode 701Fa, starting from the one end thereof. The other end of the coil electrode 901Fa is connected to one end of a coil electrode 1001Fa on the dielectric layer 110T through a via electrode VH910a.

The one end of the coil electrode 901Fb is connected to the other end of the coil electrode 801Fb through the via electrode VH89b. The coil electrode 901Fb is located in a region on the side closer to the second lateral surface than the coil electrode 901Fd and preferably has a coiled shape extending in the same winding direction as the coil electrode 701Fb, starting from the one end thereof. The other end of the coil electrode 901Fb is connected to one end of a coil electrode 1001Fb on the dielectric layer 110T through a via electrode VH910b.

On the dielectric layer 110T, the coil electrode 1001Fa is located in a region on the side where the first filter circuit is located, and the coil electrode 1001Fb is located in a region on the side where the second filter circuit is located. The one end of the coil electrode 1001Fa is connected to the other end of the coil electrode 901Fa through the via electrode VH910a. The coil electrode 1001Fa preferably has a coiled shape extending in the same winding direction as the coil electrode 901Fa, starting from the one end thereof. The other end of the coil electrode 1001Fa is connected to one end of a coil electrode 1101Fa on the dielectric layer 111T through a via electrode VH1011a.

The one end of the coil electrode 1001Fb is connected to the other end of the coil electrode 901Fb through the via electrode VH910b. The coil electrode 1001Fb preferably has a coiled shape extending in the same winding direction as the coil electrode 901Fb, starting from the one end thereof. The coil electrodes 1001Fb and 901Fb and the via electrode VH910b constitute the balanced-side inductor L4b of the second filter circuit. The other end of the coil electrode 1001Fb is connected to the second balanced terminal Pbb2 of the second filter circuit on the second lateral surface.

On the dielectric layer 111T, the coil electrode 1101Fa is located in a region on the side where the first filter circuit is located. The one end of the coil electrode 1101Fa is connected to the other end of the coil electrode 1001Fa through the via electrode VH1011a. The coil electrode 1101Fa preferably has a coiled shape extending in the same winding direction as the coil electrode 1001Fa, starting from the one end thereof. The coil electrodes 1101Fa, 1001Fa and 901Fa and the via electrodes VH910a and VH1011a constitute the balanced-side inductor L4a of the first filter circuit. The other end of the coil electrode 1101Fa is connected to the second balanced terminal Pba2 of the first filter circuit on the second lateral surface.

Plate electrodes 1201Fa, 1201Fb, 1201Fc and 1201Fd, each having a predetermined area and having a substantially rectangular shape as viewed from above, are provided on the dielectric layer 112T.

The plate electrode 1201Fc is located in a region on the side closer to the unbalanced terminal Punba of the first filter circuit, when looking at the laminate 100F from above. In other words, the plate electrode 1201Fc is located in a region substantially matching with the regions where the coil electrodes 701Fc and 901Fc are located, when looking at the laminate 100F from above. The plate electrode 1201Fc is connected to the ground terminal GND on the first lateral surface.

The plate electrode 1201Fd is located in a region on the side closer to the unbalanced terminal Punbb of the second filter circuit, when looking at the laminate 100F from above. In other words, the plate electrode 1201Fd is located in a region substantially matching with the regions where the coil electrodes 701Fd and 901Fd are located, when looking at the laminate 100F from above. The plate electrode 1201Fd is connected to the ground terminal GND on the first lateral surface.

The plate electrode 1201Fa is located in a region on the side closer to the first and second balanced terminals Pba1 and Pba2 of the first filter circuit, when looking at the laminate 100F from above. In other words, the plate electrode 1201Fa is located in a region substantially matching with the regions where the coil electrodes 901Fa, 1001Fa and 1101Fa are located, when looking at the laminate 100F from above. The plate electrode 1201Fa is connected to the second balanced terminal Pba2 of the first filter circuit on the second lateral surface.

The plate electrode 1201Fb is located in a region on the side closer to the first and second balanced terminals Pbb1 and Pbb2 of the second filter circuit, when looking at the laminate 100F from above. In other words, the plate electrode 1201Fb is located in a region substantially matching with the regions where the coil electrode 901Fb and 1001Fb are located, when looking at the laminate 100F from above. The plate electrode 1201Fb is connected to the second balanced terminal Pbb2 of the second filter circuit on the second lateral surface.

Plate electrodes 1301Fa, 1301Fb, 1301Fc and 1301Fd, each having a predetermined area and having a substantially rectangular shape as viewed from above, are provided on the dielectric layer 113T.

The plate electrode 1301Fc is arranged in opposing relation to the plate electrode 1201Fc in the stacking direction. The plate electrodes 1301Fc and 1201Fc and the dielectric layer 112T constitute the unbalanced-side capacitor C1a of the first filter circuit. The plate electrode 1301Fc is connected to the connection electrode Sea2 on the third lateral surface.

The plate electrode 1301Fd is arranged in opposing relation to the plate electrode 1201Fd in the stacking direction. The plate electrodes 1301Fd and 1201Fd and the dielectric layer 112T constitute the unbalanced-side capacitor C1b of the second filter circuit. The plate electrode 1301Fd is connected to the connection electrode Seb2 on the fourth lateral surface.

The plate electrode 1301Fa is arranged in opposing relation to the plate electrode 1201Fa in the stacking direction. The plate electrode 1301Fa is connected to the connection electrode Sea1 on the third lateral surface.

The plate electrode 1301Fb is arranged in opposing relation to the plate electrode 1201Fb in the stacking direction. The plate electrode 1301Fb is connected to the connection electrode Seb1 on the fourth lateral surface. The plate electrodes 1301Fb and 1201Fb and the dielectric layer 112T constitute the second balanced-side capacitor C3b of the second filter circuit.

Plate electrodes 1401Fa, 1401Fc and 1401Fd, each having a predetermined area and having a substantially rectangular shape as viewed from above, are provided on the dielectric layer 114T.

The plate electrode 1401Fa is arranged in opposing relation to the plate electrode 1301Fa in the stacking direction. The plate electrodes 1401Fa, 1301Fa and 1201Fa and the dielectric layers 112T and 113T constitute the second balanced-side capacitor C3a of the first filter circuit. The plate electrode 1401Fa is connected to the second balanced terminal Pba2 of the first filter circuit on the second lateral surface.

The plate electrode 1401Fc is arranged in opposing relation to the plate electrode 1301Fc in the stacking direction. The plate electrode 1401Fc is connected to the unbalanced terminal Punba of the first filter circuit on the first lateral surface.

The plate electrode 1401Fd is arranged in opposing relation to the plate electrode 1301Fd in the stacking direction. The plate electrodes 1401Fd and 1301Fd and the dielectric layer 113T constitute the capacitor C0b of the second filter circuit.

A plate electrode 1501Fc having a predetermined area and having a substantially rectangular shape, as viewed from above, is provided on the dielectric layer 115T. The plate electrode 1501Fc is arranged in opposing relation to the plate electrode 1401Fc in the stacking direction. The plate electrodes 1501Fc, 1401Fc and 1301Fc and the dielectric layers 113T and 114T constitute the capacitor C0a of the first filter circuit.

The above-described arrangement of this seventh preferred embodiment can also realize the multilayer filter having the stable balance characteristic as in the above-described preferred embodiments. In addition, since the capacitor is connected in series to the unbalanced terminal, a useless DC signal can be prevented from being input from the unbalanced terminal side.

A multilayer filter according to an eighth preferred embodiment will be described below with reference to the drawings.

Figure 20:
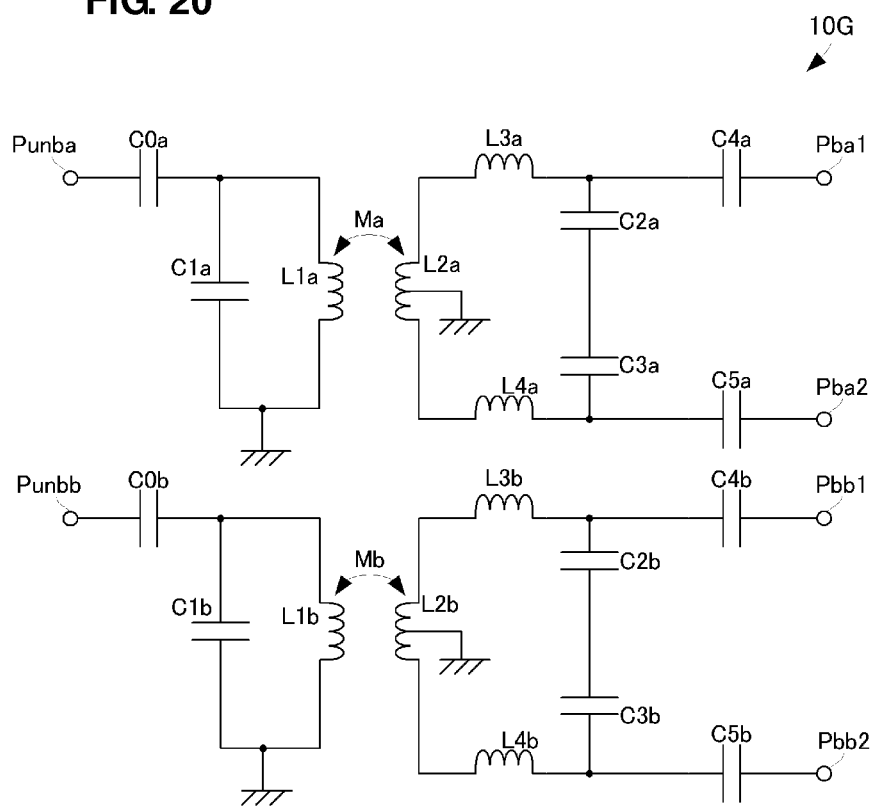
FIG. 20 is a circuit diagram of a multilayer filter according to an eighth preferred embodiment of the present invention.

FIG. 20 is a circuit diagram of a multilayer filter 10G according to the eighth preferred embodiment. As illustrated in FIG. 20, the multilayer filter 10G of this eighth preferred embodiment is provided by adding, to the multilayer filter 10F of the seventh preferred embodiment, capacitors C4a, C5a, C4b and C5b that are connected in series to the balanced terminals Pba1, Pba2, Pbb1 and Pbb2, respectively. The other circuit configuration is the same as that in the seventh preferred embodiment. Hence, the detailed description of the circuit configuration is omitted here. Further, because outer terminals of the multilayer filter 10G of this eighth preferred embodiment are arranged similarly to those of the multilayer filter 10F of the seventh preferred embodiment, the description of the arrangement of the outer terminals is also omitted here.

Figure 21:
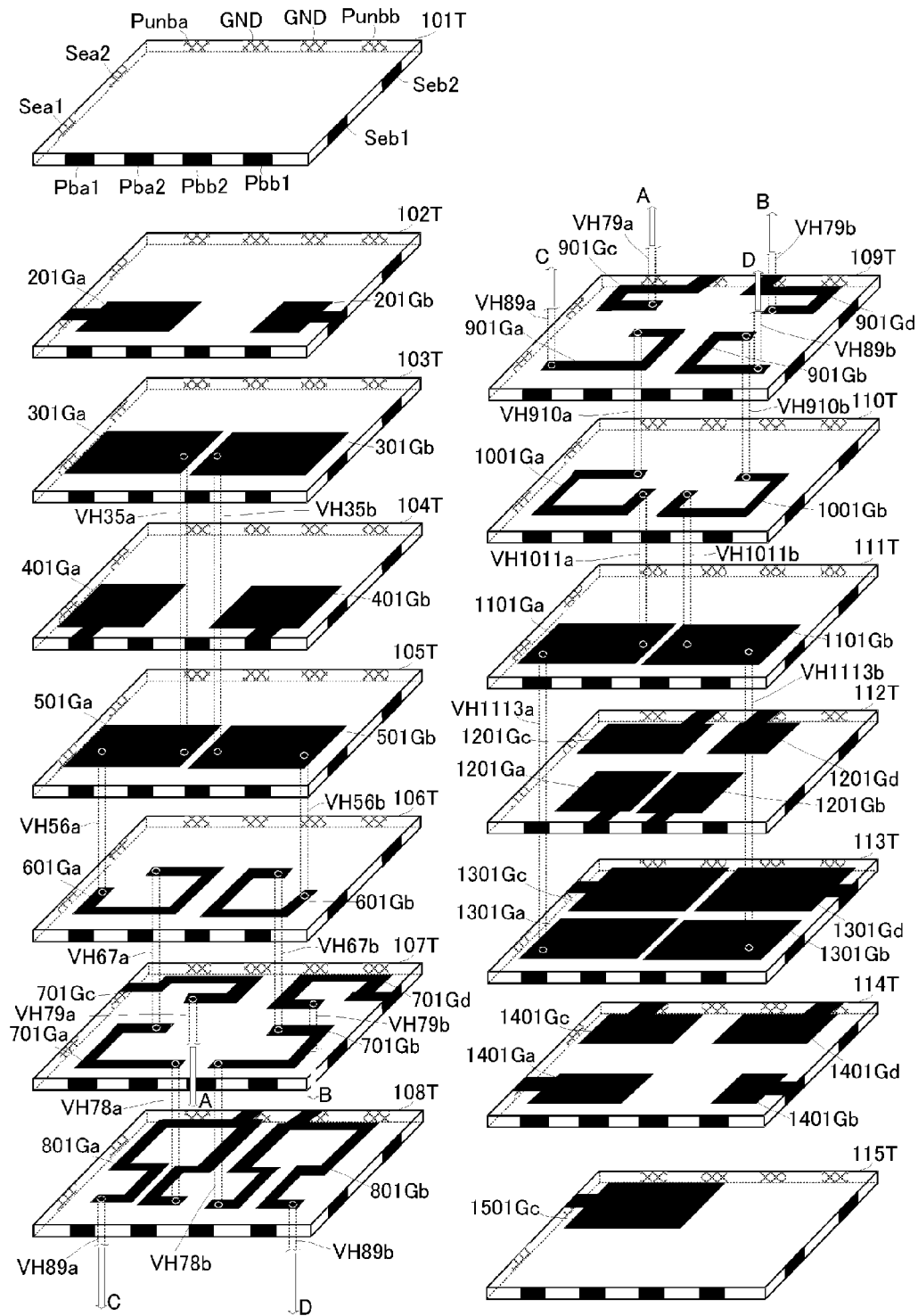
FIG. 21 is an exploded perspective view of the multilayer filter according to the eighth preferred embodiment of the present invention.

FIG. 21 is an exploded perspective view of the multilayer filter 10G according to the eighth preferred embodiment. Only the electrode patterns for the outer terminals are provided on the dielectric layer 101T that is an uppermost layer of the laminate 100G. Though not illustrated, a marking electrode used to determine the mounting direction is preferably provided on an upper surface of the dielectric layer 101T, i.e., on a top surface of the laminate 100G.

Plate electrodes 201Ga and 201Gb, each having a substantially rectangular shape as viewed from above, are provided on the dielectric layer 102T. The plate electrode 201Ga is located in a region on the side closer to the first and second balanced terminals Pba1 and Pba2 of the first filter circuit, when looking at the laminate 100G from above. The plate electrode 201Ga is connected to the connection electrode Sea1 on the third lateral surface.

The plate electrode 201Gb is located in a region on the side closer to the first and second balanced terminals Pbb1 and Pbb2 of the second filter circuit, when looking at the laminate 100G from above. The plate electrode 201Gb is connected to the connection electrode Seb1 on the fourth lateral surface.

Plate electrodes 301Ga and 301Gb, each having a substantially rectangular shape as viewed from above, are provided on the dielectric layer 103T. The plate electrode 301Ga is a floating electrode that is not directly connected to any outer terminals, and it is arranged in opposing relation to the plate electrode 201Ga in the stacking direction. The plate electrode 301Ga is connected to a plate electrode 501Ga on the dielectric layer 105T through a via electrode VH35*a*.

The plate electrode 301Gb is a floating electrode that is not directly connected to any outer terminals, and it is arranged in opposing relation to the plate electrode 201Gb in the stacking direction. The plate electrode 301Gb is connected to a plate electrode 501Gb on the dielectric layer 105T through a via electrode VH35*b*.

Plate electrodes 401Ga and 401Gb, each having a substantially rectangular shape as viewed from above, are provided on the dielectric layer 104T. The plate electrode 401Ga is arranged in opposing relation to the plate electrode 301Ga in the stacking direction. The plate electrode 401Ga is connected to the first balanced terminal Pba1 of the first filter circuit on the second lateral surface. The plate electrodes 401Ga, 301Ga and 201Ga and the dielectric layers 102T and 103T constitute the first balanced-side capacitor C2*a* of the first filter circuit.

The plate electrode 401Gb is arranged in opposing relation to the plate electrode 301Gb in the stacking direction. The plate electrode 401Gb is connected to the first balanced terminal Pbb1 of the second filter circuit on the second lateral surface. The plate electrodes 401Gb, 301Gb and 201Gb and the dielectric layers 102T and 103T constitute the first balanced-side capacitor C2*b* of the second filter circuit.

Plate electrodes 501Ga and 501Gb each being a floating electrode not directly connected to any outer terminals and having a substantially rectangular shape, as viewed from above, are provided on the dielectric layer 105T. The plate electrode 501Ga is arranged in opposing relation to the plate electrodes 401Ga and 301Ga in the stacking direction. The plate electrode 501Ga is connected to the plate electrode 301Ga through the via electrode VH35*a* and to one end of a coil electrode 601Ga on the dielectric layer 106T through a via electrode VH56*a*. The plate electrodes 501Ga and 401Ga and the dielectric layer 104T constitute the capacitor C4*a* of the first filter circuit.

The plate electrode 501Gb is arranged in opposing relation to the plate electrodes 401Gb and 301Gb in the stacking direction. The plate electrode 501Gb is connected to the plate electrode 301Gb through the via electrode VH35*b* and to one end of a coil electrode 601Gb on the dielectric layer 106T through a via electrode VH56*b*. The plate electrodes 501Gb and 401Gb and the dielectric layer 104T constitute the capacitor C4*b* of the second filter circuit.

On the dielectric layer 106T, the coil electrode 601Ga is located in a region on the side where the first filter circuit is located, and the coil electrode 601Gb is located in a region on the side where the second filter circuit is located. More specifically, the coil electrode 601Ga is located in a region on the side closer to the first and second balanced terminals Pba1 and Pba2 of the first filter circuit. The one end of the coil electrode 601Ga is connected to the plate electrode 501Ga through the via electrode VH56*a*. The coil electrode 601Ga preferably has a coiled shape in the predetermined winding direction, starting from the one end thereof. The other end of the coil electrode 601Ga is connected to one end of a coil electrode 701Ga on the dielectric layer 107T through a via electrode VH67*a*.

The coil electrode 601Gb is located in a region on the side closer to the first and second balanced terminals Pbb1 and Pbb2 of the second filter circuit. The one end of the coil electrode 601Gb is connected to the plate electrode 501Gb through the via electrode VH56*b*. The coil electrode 601Gb preferably has a coiled shape extending in the winding direction reversed to that of the coil electrode 601Ga, starting from the one end thereof. The other end of the coil electrode 601Gb is connected to one end of a coil electrode 701Gb on the dielectric layer 107T through a via electrode VH67*b*.

On the dielectric layer 107T, coil electrodes 701Ga and 701Gc are located in a region on the side where the first filter circuit is located, and coil electrodes 701Gb and 701Gd are located in a region on the side where the second filter circuit is located.

The one end of the coil electrode 701Ga is connected to the other end of the coil electrode 601Ga through the via electrode VH67*a*. The coil electrode 701Ga preferably has a coiled shape extending in the same winding direction as the coil electrode 601Ga, starting from the one end thereof. The coil electrodes 701Ga and 601Ga and the via electrode VH67*a* constitute the balanced-side inductor L3*a* of the first filter circuit. The other end of the coil electrode 701Ga is connected to one end of a coil electrode 801Ga on the dielectric layer 108T through a via electrode VH78*a*.

The one end of the coil electrode 701Gb is connected to the other end of the coil electrode 601Gb through the via electrode VH67*b*. The coil electrode 701Gb preferably has a coiled shape extending in the same winding direction as the coil electrode 601Gb, starting from the one end thereof. The coil electrodes 701Gb and 601Gb and the via electrode VH67*b* constitute the balanced-side inductor L3*b* of the second filter circuit. The other end of the coil electrode 701Gb is connected to one end of a coil electrode 801Gb on the dielectric layer 108T through a via electrode VH78*b*.

The coil electrode 701Gc is located on the side closer to the first lateral surface than the coil electrode 701Ga, i.e., on the side closer to the unbalanced terminal Punba of the first filter circuit, as viewed from above. One end of the coil electrode 701Gc is connected to the connection electrode Sea2 on the third lateral surface. The coil electrode 701Gc preferably has a coiled shape, starting from the one end thereof. The other end of the coil electrode 701Gc is connected to one end of a coil electrode 901Gc on the dielectric layer 109T through a via electrode VH79a.

The coil electrode 701Gd is located on the side closer to the first lateral surface than the coil electrode 701Gb, i.e., on the side closer to the unbalanced terminal Punbb of the second filter circuit, as viewed from above. One end of the coil electrode 701Gd is connected to the connection electrode Seb2 on the fourth lateral surface. The coil electrode 701Gd preferably has a coiled shape extending in the winding direction reversed to that of the coil electrode 701Gc, starting from the one end thereof. The other end of the coil electrode 701Gd is connected to one end of a coil electrode 901Gd on the dielectric layer 109T through a via electrode VH79b.

On the dielectric layer 108T, the coil electrode 801Ga is located in a region on the side where the first filter circuit is located, and the coil electrode 801Gb is located in a region on the side where the second filter circuit is located.

The one end of the coil electrode 801Ga is connected to the other end of the coil electrode 701Ga through the via electrode VH78a. The coil electrode 801Ga preferably has a coiled shape, starting from the one end thereof. In addition, the coil electrode 801Ga preferably has such a shape that at least a portion thereof overlaps with the coil electrode 701Gc, as viewed from above, for electromagnetic coupling with the coil electrode 701Gc. The other end of the coil electrode 801Ga is connected to one end of a coil electrode 901Ga on the dielectric layer 109T through a via electrode VH89a. The coil electrode 801Ga constitutes the balanced-side inductor L2a of the first filter circuit.

The one end of the coil electrode 801Gb is connected to the other end of the coil electrode 701Gb through the via electrode VH78b. The coil electrode 801Gb preferably has a coiled shape, starting from the one end thereof. In addition, the coil electrode 801Gb preferably has such a shape that at least a portion thereof overlaps with the coil electrode 701Gd, as viewed from above, for electromagnetic coupling with the coil electrode 701Gd. The other end of the coil electrode 801Gb is connected to one end of a coil electrode 901Gb on the dielectric layer 109T through a via electrode VH89b. The coil electrode 801Gb constitutes the balanced-side inductor L2b of the second filter circuit.

On the dielectric layer 109T, the coil electrodes 901Ga and 901Gc are located in a region on the side where the first filter circuit is located, and the coil electrodes 901Gb and 901Gd are located in a region on the side where the second filter circuit is located.

The one end of the coil electrode 901Gc is connected to the other end of the coil electrode 701Gc through the via electrode VH79a. The coil electrode 901Gc preferably has a coiled shape extending in the same winding direction as the coil electrode 701Gc, starting from the one end thereof. The coil electrode 901Ga and the coil electrode 701Gc are arranged such that their regions are substantially matched with each other as viewed from above. The coil electrodes 901Gc and 701Gc and the via electrode VH79a constitute the unbalanced-side inductor L1a of the first filter circuit. The other end of the coil electrode 901Gc is connected to the ground terminal GND on the first lateral surface.

The one end of the coil electrode 901Ga is connected to the other end of the coil electrode 801Ga through the via electrode VH89a. The coil electrode 901Ga is located in a region on the side closer to the second lateral surface than the coil electrode 901Gc and preferably has a coiled shape extending in the same winding direction as the coil electrode 701Ga, starting from the one end thereof. The other end of the coil electrode 901Ga is connected to one end of a coil electrode 1001Ga on the dielectric layer 110T through a via electrode VH910a.

The one end of the coil electrode 901Gb is connected to the other end of the coil electrode 801Gb through the via electrode VH89b. The coil electrode 901Gb is located in a region on the side closer to the second lateral surface than the coil electrode 901Gd and preferably has a coiled shape extending in the same winding direction as the coil electrode 701Gb, starting from the one end thereof. The other end of the coil electrode 901Gb is connected to one end of a coil electrode 1001Gb on the dielectric layer 110T through a via electrode VH910b.

On the dielectric layer 110T, the coil electrode 1001Ga is located in a region on the side where the first filter circuit is located, and the coil electrode 1001Gb is located in a region on the side where the second filter circuit is located. The one end of the coil electrode 1001Ga is connected to the other end of the coil electrode 901Ga through the via electrode VH910a. The coil electrode 1001Ga preferably has a coiled shape extending in the same winding direction as the coil electrode 901Ga, starting from the one end thereof. The coil electrodes 1001Ga and 901Ga and the via electrode VH910a constitute the balanced-side inductor L4a of the first filter circuit. The other end of the coil electrode 1001Ga is connected to a plate electrode 1101Ga on the dielectric layer 111T through a via electrode VH1011a.

The one end of the coil electrode 1001Gb is connected to the other end of the coil electrode 901Gb through the via electrode VH910b. The coil electrode 1001Gb preferably has a coiled shape extending in the same winding direction as the coil electrode 901Gb, starting from the one end thereof. The coil electrodes 1001Gb and 901Gb and the via electrode VH910b constitute the balanced-side inductor L4b of the second filter circuit. The other end of the coil electrode 1001Gb is connected to a plate electrode 1101Gb on the dielectric layer 111T through a via electrode VH1011b.

The plate electrodes 1101Ga and 1101Gb, each having a predetermined area and having a substantially rectangular shape as viewed from above, are provided on the dielectric layer 111T. The plate electrodes 1101Ga and 1101Gb are floating electrodes that are not directly connected to any outer terminals.

The plate electrode 1101Ga is located in a region on the side closer to the first and second balanced terminals Pba1 and Pba2 of the first filter circuit, when looking at the laminate 100G from above. In other words, the plate electrode 1101Ga is located in a region substantially matching with the regions where the coil electrode 901Ga and 1001Ga are located, when looking at the laminate 100G from above. The plate electrode 1101Ga is connected to a plate electrode 1301Ga on the dielectric layer 113T through a via electrode VH1113a.

The plate electrode 1101Gb is located in a region on the side closer to the first and second balanced terminals Pbb1 and Pbb2 of the second filter circuit, when looking at the laminate 100G from above. In other words, the plate electrode 1101Gb is located in a region substantially matching with the regions where the coil electrode 901Gb and 1001Gb are located, when looking at the laminate 100G from above. The plate electrode 1101Gb is connected to a plate electrode 1301Gb on the dielectric layer 113T through a via electrode VH1113b.

Plate electrodes 1201Ga, 1201Gb, 1201Gc and 1201Gd, each having a predetermined area and having a substantially rectangular shape as viewed from above, are provided on the dielectric layer 112T.

The plate electrode 1201Ga is arranged in opposing relation to the plate electrode 1101Ga in the stacking direction. The plate electrodes 1201Ga and 1101Ga and the dielectric layer 111T constitute the capacitor C5a of the first filter circuit. The plate electrode 1201Ga is connected to the second balanced terminal Pba2 of the first filter circuit on the second lateral surface.

The plate electrode 1201Gb is arranged in opposing relation to the plate electrode 1101Gb in the stacking direction. The plate electrodes 1201Gb and 1101Gb and the dielectric layer 111T constitute the capacitor C5b of the second filter circuit. The plate electrode 1201Gb is connected to the second balanced terminal Pbb2 of the second filter circuit on the second lateral surface.

The plate electrode 1201Gc is located in a region on the side closer to the unbalanced terminal Punba of the first filter circuit, when looking at the laminate 100G from above. In other words, the plate electrode 1201Gc is located in a region substantially matching with the regions where the coil electrodes 701Gc and 901Gc are located, when looking at the laminate 100G from above. The plate electrode 1201Gc is connected to the ground terminal GND on the first lateral surface.

The plate electrode 1201Gd is located in a region on the side closer to the unbalanced terminal Punbb of the second filter circuit, when looking at the laminate 100G from above. In other words, the plate electrode 1201Gd is located in a region substantially matching with the regions where the coil electrodes 701Gd and 901Gd are located, when looking at the laminate 100G from above. The plate electrode 1201Gd is connected to the ground terminal GND on the first lateral surface.

Plate electrodes 1301Ga, 1301Gb, 1301Gc and 1301Gd, each having a predetermined area and having a substantially rectangular shape as viewed from above, are provided on the dielectric layer 113T.

The plate electrode 1301Gc is arranged in opposing relation to the plate electrode 1201Gc in the stacking direction. The plate electrodes 1301Gc and 1201Gc and the dielectric layer 112T constitute the unbalanced-side capacitor C1a of the first filter circuit. The plate electrode 1301Gc is connected to the connection electrode Sea2 on the third lateral surface.

The plate electrode 1301Gd is arranged in opposing relation to the plate electrode 1201Gd in the stacking direction. The plate electrodes 1301Gd and 1201Gd and the dielectric layer 112T constitute the unbalanced-side capacitor C1b of the second filter circuit. The plate electrode 1301Gd is connected to the connection electrode Seb2 on the fourth lateral surface.

The plate electrode 1301Ga is arranged in opposing relation to the plate electrodes 1101Ga and 1201Ga in the stacking direction. The plate electrode 1301Ga is a floating electrode that is not directly connected to any outer terminals. The plate electrode 1301Ga is connected to the plate electrode 1101Ga through the via electrode VH1113a.

The plate electrode 1301Gb is arranged in opposing relation to the plate electrodes 1101Gb and 1201Gb in the stacking direction. The plate electrode 1301Gb is a floating electrode that is not directly connected to any outer terminals. The plate electrode 1301Gb is connected to the plate electrode 1101Gb through the via electrode VH1113b.

Plate electrodes 1401Ga, 1401Gb, 1401Gc and 1401Gd, each having a predetermined area and having a substantially rectangular shape as viewed from above, are provided on the dielectric layer 114T.

The plate electrode 1401Ga is arranged in opposing relation to the plate electrode 1301Ga in the stacking direction.

The plate electrode 1401Ga is connected to the connection electrode Sea1 on the third lateral surface. The plate electrodes 1401Ga, 1301Ga and 1201Ga and the dielectric layers 112T and 113T constitute the second balanced-side capacitor C3a of the first filter circuit.

The plate electrode 1401Gb is arranged in opposing relation to the plate electrode 1301Gb in the stacking direction. The plate electrode 1401Gb is connected to the connection electrode Seb1 on the fourth lateral surface. The plate electrodes 1401Gb, 1301Gb and 1201Gb and the dielectric layers 112T and 113T constitute the second balanced-side capacitor C3b of the second filter circuit.

The plate electrode 1401Gc is arranged in opposing relation to the plate electrode 1301Gc in the stacking direction. The plate electrode 1401Gc is connected to the unbalanced terminal Punba of the first filter circuit on the first lateral surface.

The plate electrode 1401Gd is arranged in opposing relation to the plate electrode 1301Gd in the stacking direction. The plate electrodes 1401Gd and 1301Gd and the dielectric layer 113T constitute the capacitor C0b of the second filter circuit. The plate electrode 1401Gd is connected to the unbalanced terminal Punbb of the second filter circuit on the first lateral surface.

A plate electrode 1501Gc having a predetermined area and having a substantially rectangular shape, as viewed from above, is provided on the dielectric layer 115T. The plate electrode 1501Gc is arranged in opposing relation to the plate electrode 1401Gc in the stacking direction. The plate electrodes 1501Gc, 1401Gc and 1301Gc and the dielectric layers 113T and 114T constitute the capacitor C0a of the first filter circuit.

The above-described arrangement of this eighth preferred embodiment can also realize the multilayer filter having the stable phase balance as in the above-described preferred embodiments. In addition, since the capacitor is connected in series to each of the unbalanced terminals and the balanced terminals, a useless DC signal can be prevented from being input from the unbalanced terminal side and the balanced terminal side.

A multilayer filter according to a ninth preferred embodiment will be described below with reference to the drawings. A multilayer filter 10H of this ninth preferred embodiment has the same circuit configuration as that of the multilayer filter 10D of the fifth preferred embodiment, and hence the detailed description of the circuit configuration is omitted here.

Figure 22:
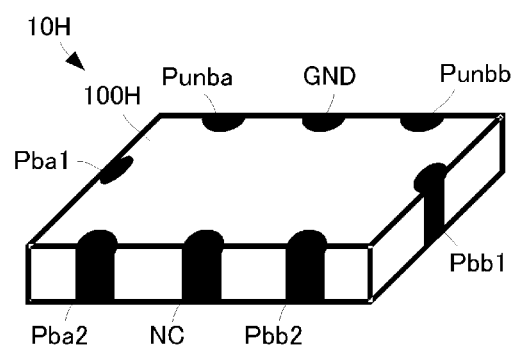
FIG. 22 is an external perspective view of a multilayer filter according to a ninth preferred embodiment of the present invention.
Figure 23:
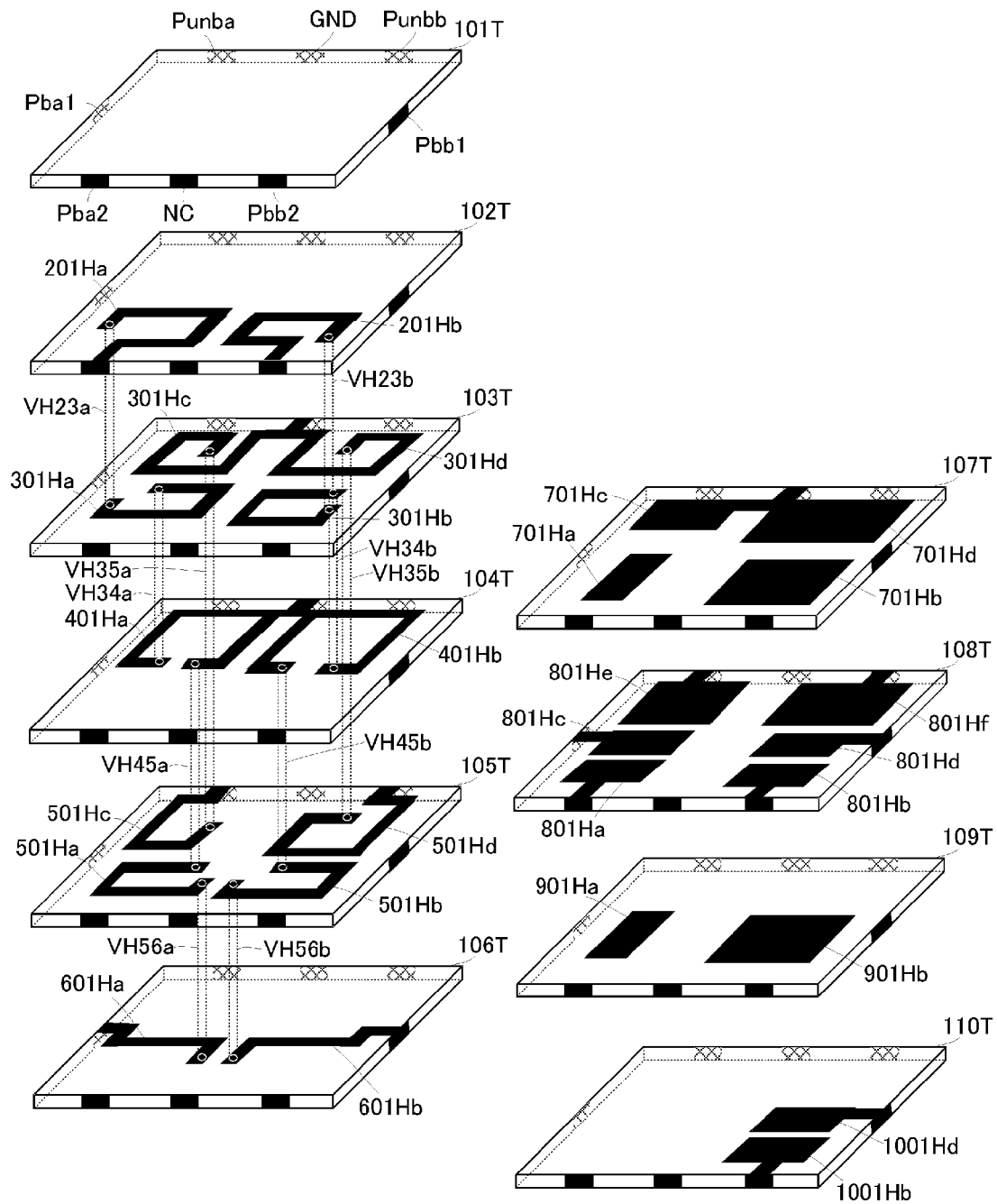
FIG. 23 is an exploded perspective view of the multilayer filter according to the ninth preferred embodiment of the present invention.

FIG. 22 is an external perspective view of the multilayer filter 10H according to the ninth preferred embodiment, and FIG. 23 is an exploded perspective view of the multilayer filter 10H according to the ninth preferred embodiment.

The circuit elements constituting the first filter circuit and the circuit elements constituting the second filter circuit are located in separate regions, when looking at a laminate 100H from above, so that the circuit elements of the first and second filter circuits are not coupled with each other in a high-frequency range. Further, winding directions of inductors are reversed between the first and second filter circuits, as seen from FIG. 23 in which the winding directions in a practical example are illustrated. Such a structure can prevent coupling between the first filter circuit and the second filter circuit.

The multilayer filter 10H is realized with the laminate 100H that preferably includes ten dielectric layers 101T to 110T, for example, stacked on each other.

As illustrated in FIG. 22, the laminate 100H preferably is substantially parallelepiped in its external shape. An outer electrode for the unbalanced terminal (hereinafter referred to as the "unbalanced terminal Punba") of the first filter circuit, a ground electrode (hereinafter referred to as the "ground terminal GND"), and an outer electrode for the unbalanced terminal (hereinafter referred to as the "unbalanced terminal Punbb") of the second filter circuit are located on a first lateral surface of the laminate 100H and are arranged in the order named. In this ninth preferred embodiment, one ground terminal GND is provided on the first lateral surface.

An outer electrode for the second balanced terminal (hereinafter referred to as the "second balanced terminal Pba2") of the first filter circuit and an outer electrode for the second balanced terminal (hereinafter referred to as the "second balanced terminal Pbb2") of the second filter circuit are located on a second lateral surface of the laminate 100H, which is positioned opposite to the first lateral surface, with an NC terminal positioned therebetween and are arranged in the order named. In such a structure, the unbalanced terminal Punba and the second balanced terminal Pba2 of the first filter circuit are arranged opposite to each other.

An outer electrode for the first balanced terminal (hereinafter referred to as the "first balanced terminal Pba1") of the first filter circuit is provided on a third lateral surface, which is perpendicular to the first and second lateral surfaces and which is positioned on the first filter circuit side. An outer electrode for the first balanced terminal (hereinafter referred to as the "first balanced terminal Pbb1") of the second filter circuit is provided on a fourth lateral surface, which is perpendicular to the first and second lateral surfaces and which is positioned on the second filter circuit side. In the following description of the dielectric layers, as in the description of those in the foregoing preferred embodiments, the positions where the outer terminals are located and the shapes thereof are not described except for connection relationships of the outer terminals with respect to inner layer electrodes.

Only the electrode patterns for the above-mentioned outer terminals are provided on the dielectric layer 101T that is an uppermost layer of the laminate 100H. Though not illustrated, a marking electrode used to determine the mounting direction is preferably provided on an upper surface of the dielectric layer 101T, i.e., on a top surface of the laminate 100H.

Coil electrodes 201Ha and 201Hb are provided on the dielectric layer 102T. One end of the coil electrode 201Ha is connected to the second balanced terminal Pba2 of the first filter circuit on the second lateral surface. The coil electrode 201Ha preferably has a coiled shape, as viewed from above, starting from the one end thereof. The other end of the coil electrode 201Ha is connected to one end of a coil electrode 301Ha on the dielectric layer 103T through an electroconductive via electrode VH23a.

One end of the coil electrode 201Hb is connected to the second balanced terminal Pbb2 of the second filter circuit on the second lateral surface. The coil electrode 201Hb preferably has a coiled shape, as viewed from above, starting from the one end thereof. The other end of the coil electrode 201Hb is connected to one end of a coil electrode 301Hb on the dielectric layer 103T through an electroconductive via electrode VH23b.

Coil electrodes 301Ha, 301Hb, 301Hc and 301Hd are provided on the dielectric layer 103T.

The one end of the coil electrode 301Ha is connected to the other end of the coil electrode 201Ha through the via electrode VH23a. The coil electrode 301Ha preferably has a coiled shape extending in the same winding direction as the coil electrode 201Ha, as viewed from above, starting from the one end thereof. The other end of the coil electrode 301Ha is connected to one end of a coil electrode 401Ha on the dielectric layer 104T through an electroconductive via electrode VH34a. The coil electrode 301Ha, the coil electrode 201Ha, and the via electrode VH23a constitute the balanced-side inductor L4a of the first filter circuit.

The one end of the coil electrode 301Hb is connected to the other end of the coil electrode 201Hb through the via electrode VH23b. The coil electrode 301Hb preferably has a coiled shape extending in the same winding direction as the coil electrode 201Hb, as viewed from above, starting from the one end thereof. The other end of the coil electrode 301Hb is connected to one end of a coil electrode 401Hb on the dielectric layer 104T through an electroconductive via electrode VH34b. The coil electrode 301Hb, the coil electrode 201Hb, and the via electrode VH23b constitute the balanced-side inductor L4b of the second filter circuit.

One end of the coil electrode 301Hc is connected to the ground terminal GND on the first lateral surface. The coil electrode 301Hc preferably has a coiled shape, as viewed from above, starting from the one end thereof. The other end of the coil electrode 301Hc is connected to one end of a coil electrode 501Hc on the dielectric layer 105T through an electroconductive via electrode VH35a.

One end of the coil electrode 301Hd is connected to the ground terminal GND on the first lateral surface. The coil electrode 301Hd preferably has a coiled shape, as viewed from above, starting from the one end thereof. The other end of the coil electrode 301Hd is connected to one end of a coil electrode 501Hd on the dielectric layer 105T through an electroconductive via electrode VH35b. The one end of the coil electrode 301Hc and the one end of the coil electrode 301Hd are connected to one ground terminal GND through a common electrode for connection to the ground.

The coil electrodes 401Ha and 401Hb are provided on the dielectric layer 104T. The one end of the coil electrode 401Ha is connected to the other end of the coil electrode 301Ha through the via electrode VH34a. The coil electrode 401Ha preferably has a coiled shape such that at least a portion thereof overlaps with the coil electrode 301Hc, as viewed from above, for electromagnetic coupling with the coil electrode 301Hc. The other end of the coil electrode 401Ha is connected to one end of a coil electrode 501Ha on the dielectric layer 105T through a via electrode VH45a. The coil electrode 401Ha constitutes the balanced-side inductor L2a of the first filter circuit.

The one end of the coil electrode 401Hb is connected to the other end of the coil electrode 301Hb through the via electrode VH34b. The coil electrode 401Hb preferably has a coiled shape such that at least a portion thereof overlaps with the coil electrode 301Hd, as viewed from above, for electromagnetic coupling with the coil electrode 301Hd. The other end of the coil electrode 401Hb is connected to one end of a coil electrode 501Hb on the dielectric layer 105T through a via electrode VH45b. The coil electrode 401Hb constitutes the balanced-side inductor L2b of the second filter circuit.

The coil electrodes 401Ha and 401Hb are connected at predetermined positions along the coiled shapes thereof to the ground terminal GND on the first lateral surface through a common electrode for connection to the ground. The balanced-side inductors L2a and L2b are thereby connected at their predetermined points to the ground.

The coil electrodes 501Ha, 501Hb, 501Hc and 501Hd are provided on the dielectric layer 105T.

The one end of the coil electrode 501Ha is connected to the other end of the coil electrode 401Ha through the via electrode VH45a. The coil electrode 501Ha preferably has a coiled shape, as viewed from above, starting from the one end thereof. The coil electrode 501Ha is located in a region on the side closer to the first and second balanced terminals Pba1 and Pba2 of the first filter circuit, i.e., in a region overlapping with the coil electrodes 201Ha and 301Ha, when looking at the laminate 100H from above. The other end of the coil electrode 501Ha is connected to one end of a coil electrode 601Ha on the dielectric layer 106T through a via electrode VH56a.

The one end of the coil electrode 501Hb is connected to the other end of the coil electrode 401Hb through the via electrode VH45b. The coil electrode 501Hb preferably has a coiled shape, as viewed from above, starting from the one end thereof. The coil electrode 501Hb is located in a region on the side closer to the first and second balanced terminals Pbb1 and Pbb2 of the second filter circuit, i.e., in a region overlapping with the coil electrodes 201Hb and 301Hb, when looking at the laminate 100H from above. The other end of the coil electrode 501Hb is connected to one end of a coil electrode 601Hb on the dielectric layer 106T through a via electrode VH56b.

The one end of the coil electrode 501Hc is connected to the other end of the coil electrode 301Hc through the via electrode VH35a. The coil electrode 501Hc preferably has a coiled shape extending in the same winding direction as the coil electrode 301Hc, as viewed from above, starting from the one end thereof. Further, the coil electrode 501Hc is located at a position where at least a portion thereof overlaps with the coil electrode 401Ha, when looking at the laminate 100H from above, for electromagnetic coupling with the coil electrode 401Ha. The other end of the coil electrode 501Hc is connected to the unbalanced terminal Punba of the first filter circuit. The coil electrode 501Hc, the coil electrode 301Hc, and the via electrode VH35a constitute the unbalanced-side inductor L1a of the first filter circuit.

The one end of the coil electrode 501Hd is connected to the other end of the coil electrode 301Hd through the via electrode VH35b. The coil electrode 501Hd preferably has a coiled shape extending in the same winding direction as the coil electrode 301Hd, as viewed from above, starting from the one end thereof. Further, the coil electrode 501Hd is located at a position where at least a portion thereof overlaps with the coil electrode 401Hb, when looking at the laminate 100H from above, for electromagnetic coupling with the coil electrode 401Hb. The other end of the coil electrode 501Hd is connected to the unbalanced terminal Punbb of the second filter circuit. The coil electrode 501Hd, the coil electrode 301Hd, and the via electrode VH35b constitute the unbalanced-side inductor Lib of the second filter circuit.

The coil electrodes 601Ha and 601Hb are provided on the dielectric layer 106T. The one end of the coil electrode 601Ha is connected to the other end of the coil electrode 501Ha through the via electrode VH56a. The coil electrode 601Ha preferably has a coiled shape extending in the same winding direction as the coil electrode 501Ha, as viewed from above, starting from the one end thereof. The coil electrode 601Ha, the coil electrode 501Ha, and the via electrode VH56a constitute the balanced-side inductor L3a of the first filter circuit.

The one end of the coil electrode 601Hb is connected to the other end of the coil electrode 501Hb through the via electrode VH56b. The coil electrode 601Hb preferably has a coiled shape extending in the same winding direction as the coil electrode 501Hb, as viewed from above, starting from the one end thereof. The coil electrode 601Hb, the coil electrode 501Hb, and the via electrode VH56b constitute the balanced-side inductor L3b of the second filter circuit.

Plate electrodes 701Ha, 701Hb, 701Hc and 701Hd, each having a predetermined area and having a substantially rectangular shape as viewed from above, are provided on the dielectric layer 107T.

The plate electrode 701Hc is located in a region on the side closer to the unbalanced terminal Punba of the first filter circuit, when looking at the laminate 100H from above. In other words, the plate electrode 701Hc is located in a region substantially matching with the regions where the coil electrodes 301Hc and 501Hc are located, when looking at the laminate 100H from above. The plate electrode 701Hc is connected to the ground terminal GND on the first lateral surface.

The plate electrode 701Hd is located in a region on the side closer to the unbalanced terminal Punbb of the second filter circuit, when looking at the laminate 100H from above. In other words, the plate electrode 701Hd is located in a region substantially matching with the regions where the coil electrodes 301Hd and 501Hd are located, when looking at the laminate 100H from above. The plate electrode 701Hd is connected to the ground terminal GND on the first lateral surface.

In the above arrangement, the plate electrodes 701Hc and 701Hd are connected to one ground terminal GND through a common electrode for connection to the ground.

The plate electrode 701Ha is located in a region on the side closer to the second balanced terminal Pba2 of the first filter circuit, when looking at the laminate 100H from above. The plate electrode 701Ha is a floating electrode that is not connected to any outer terminals including the ground terminal GND.

The plate electrode 701Hb is located in a region on the side closer to the second balanced terminal Pbb2 of the second filter circuit, when looking at the laminate 100H from above. The plate electrode 701Hb is a floating electrode that is not connected to any outer terminals including the ground terminal GND.

Plate electrodes 801Ha, 801Hb, 801Hc, 801Hd, 801He and 801Hf, each having a predetermined area and having a substantially rectangular shape as viewed from above, are provided on the dielectric layer 108T.

The plate electrode 801He is arranged in opposing relation to the plate electrode 701Hc in the stacking direction, i.e., when looking at the laminate 100H from above. The plate electrodes 801He and 701Hc and the dielectric layer 107T constitute the unbalanced-side capacitor C1a of the first filter circuit. The plate electrode 801He is connected to the unbalanced terminal Punba of the first filter circuit on the first lateral surface.

The plate electrode 801Hf is arranged in opposing relation to the plate electrode 701Hd in the stacking direction, i.e., when looking at the laminate 100F from above. The plate electrodes 801Hf and 701Hd and the dielectric layer 107T constitute the unbalanced-side capacitor C1b of the second filter circuit. The plate electrode 801Hf is connected to the unbalanced terminal Punbb of the second filter circuit on the first lateral surface.

The plate electrodes 801Ha and 801Hc are each arranged in opposing relation to the plate electrode 701Ha in the stacking direction. The plate electrode 801Ha is connected to the second balanced terminal Pba2 of the first filter circuit on the second lateral surface, and the plate electrode 801Hc is connected to the first balanced terminal Pba1 of the first filter circuit on the third lateral surface.

The plate electrodes 801Hb and 801Hd are each arranged in opposing relation to the plate electrode 701Hb in the stacking direction. The plate electrode 801Hb is connected to the second balanced terminal Pbb2 of the second filter circuit on the second lateral surface, and the plate electrode 801Hd is connected to the first balanced terminal Pbb1 of the second filter circuit on the fourth lateral surface.

Plate electrodes 901Ha and 901Hb, each having a predetermined area and having a substantially rectangular shape as viewed from above, are provided on the dielectric layer 109T. The plate electrode 901Ha is arranged in opposing relation to the plate electrodes 801Ha and 801Hc in the stacking direction. The plate electrodes 901Ha, 801Ha and 701Ha and the dielectric layers 107T and 108T constitute the second balanced-side capacitor C3a of the first filter circuit. The plate electrodes 901Ha, 801Hc and 701Ha and the dielectric layers 107T and 108T constitute the first balanced-side capacitor C2a of the first filter circuit.

The plate electrode 901Hb is arranged in opposing relation to the plate electrodes 801Hb and 801Hd in the stacking direction.

Plate electrodes 1001Hb and 1001Hd, each having a predetermined area and having a substantially rectangular shape as viewed from above, are provided on the dielectric layer 110T. The plate electrodes 1001Hb and 1001Hd are each arranged in opposing relation to the plate electrode 901Hb in the stacking direction.

The plate electrodes 701Hb, 801Hb, 901Hb and 1001Hb and the dielectric layers 107T, 108T and 109T constitute the second balanced-side capacitor C3b of the second filter circuit. The plate electrodes 701Hb, 801Hd, 901Hb and 1001Hd and the dielectric layers 107T, 108T and 109T constitute the first balanced-side capacitor C2b of the second filter circuit.

The plate electrode 1001Hb is connected to the second balanced terminal Pbb2 of the second filter circuit on the second lateral surface. The plate electrode 1001Hd is connected to the first balanced terminal Pbb1 of the second filter circuit on the fourth lateral surface.

The above-described arrangement of this ninth preferred embodiment can also realize the multilayer filter having the stable balance characteristic as in the above-described preferred embodiments. In addition, since the ground terminal GND is shared by the first filter circuit and the second filter circuit and only one ground terminal is provided on the lateral surface of the laminate 100H, the size of the laminate 100H can be further reduced.

While a capacitance (capacity) ratio between the balanced-side capacitors C2 and C3 is not specified in the above-described preferred embodiments, the capacitance ratio may be appropriately set depending on the other circuit elements and circuit patterns constituting the multilayer filter. Such setting may be performed by changing respective areas of the opposed plate electrodes of the balanced-side capacitors C2 and C3.

The number of dielectric layers stacked in each of the above-described preferred embodiments may be appropriately set, as required, depending on the specifications, etc.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer filter comprising:
    a laminate including a plurality of dielectric layers stacked on each other;
    an unbalanced terminal;
    a first balanced terminal;
    a second balanced terminal; and
    a filter circuit; wherein
    a capacitor is connected between the first balanced terminal and the second balanced terminal;
    the capacitor includes a first capacitor including, as one of opposed electrodes thereof, a first inner-layer plate electrode electrically connected to a terminal electrode of the first balanced terminal and, as the other of the opposed electrodes of the first capacitor, a first floating electrode not connected to a ground, and a second capacitor including, as one of opposed electrodes thereof, a second inner-layer plate electrode electrically connected to a terminal electrode of the second balanced terminal and, as the other of the opposed electrodes of the second capacitor, a second floating electrode not connected to the ground, the first capacitor and the second capacitor being connected in series;
    a first electrode group including the first inner-layer plate electrode and the first floating electrode and a second electrode group including the second inner-layer plate electrode and the second floating electrode are located on different ones of the plurality of dielectric layers; and
    the first electrode group and the second electrode group are arranged to be at least partially overlapped with each other, when looking at the laminate in a stacking direction thereof.

2. The multilayer filter according to claim 1, wherein respective shapes of the first inner-layer plate electrode, the second inner-layer plate electrode, the first floating electrode, and the second floating electrode and thicknesses of the plurality of dielectric layers are determined such that the first capacitor and the second capacitor have a same capacitance.

3. The multilayer filter according to claim 1, wherein:
    an unbalanced-side inductor electrode and an electrode pair constituting an unbalanced-side capacitor are connected between a terminal electrode of the unbalanced terminal and a ground electrode;
    at least three odd-numbered balanced-side inductor electrodes are connected in series between the terminal electrode of the first balanced terminal and the terminal electrode of the second balanced terminal;
    one of the at least three odd-numbered balanced-side inductor electrodes at a center in an array sequence thereof and the unbalanced-side inductor electrode are arranged to be electromagnetically coupled with each other; and
    the at least three odd-numbered balanced-side inductor electrodes include substantially helical coils each extending in the same winding direction when viewed in the stacking direction.

4. The multilayer filter according to claim 1, wherein respective shapes of the first inner-layer plate electrode, the second inner-layer plate electrode, the first floating electrode, and the second floating electrode and thicknesses of the plurality of dielectric layers are determined such that the first capacitor and the second capacitor have different capacitances.

5. A multilayer filter comprising:
    a laminate including a plurality of dielectric layers stacked on each other;
    an unbalanced terminal;
    a first balanced terminal;
    a second balanced terminal; and
    a filter circuit; wherein
    a capacitor is connected between the first balanced terminal and the second balanced terminal;
    the capacitor includes a first capacitor including, as one of opposed electrodes thereof, a first inner-layer plate electrode electrically connected to a terminal electrode of the first balanced terminal and, as the other of the opposed electrodes of the first capacitor, a first floating electrode not connected to a ground, and a second capacitor including, as one of opposed electrodes thereof, a second inner-layer plate electrode electrically connected to a terminal electrode of the second balanced terminal and, as the other of the opposed electrodes of the second capacitor, a second floating electrode not connected to the ground, the first capacitor and the second capacitor being connected in series;

an unbalanced-side inductor electrode and an electrode pair constituting an unbalanced-side capacitor are connected between a terminal electrode of the unbalanced terminal and a ground electrode;

at least three odd-numbered balanced-side inductor electrodes are connected in series between the terminal electrode of the first balanced terminal and the terminal electrode of the second balanced terminal;

one of the at least three odd-numbered balanced-side inductor electrodes at a center in an array sequence thereof and the unbalanced-side inductor electrode are arranged to be electromagnetically coupled with each other; and the at least three odd-numbered balanced-side inductor electrodes include substantially helical coils each extending in the same winding direction when viewed in the stacking direction.

6. The multilayer filter according to claim 5, wherein respective shapes of the first inner-layer plate electrode, the second inner-layer plate electrode, the first floating electrode, and the second floating electrode and thicknesses of the plurality of dielectric layers are determined such that the first capacitor and the second capacitor have a same capacitance.

7. The multilayer filter according to claim 5, wherein respective shapes of the first inner-layer plate electrode, the second inner-layer plate electrode, the first floating electrode, and the second floating electrode and thicknesses of the plurality of dielectric layers are determined such that the first capacitor and the second capacitor have different capacitances.

8. The multilayer filter according to claim 7, wherein the first floating electrode and the second floating electrode are defined by one common floating electrode.

* * * * *